US011990417B2

(12) United States Patent
Kitayama et al.

(10) Patent No.: US 11,990,417 B2
(45) Date of Patent: May 21, 2024

(54) SEMICONDUCTOR MEMORY DEVICE WITH DIFFERENT FLUORINE CONCENTRATIONS IN SUB CONDUCTIVE LAYERS

(71) Applicant: Kioxia Corporation, Tokyo (JP)

(72) Inventors: Hiroki Kitayama, Yokkaichi Mie (JP);
Mitsuo Ikeda, Yokkaichi Mie (JP);
Daisuke Ikeno, Yokkaichi Mie (JP);
Akihiro Kajita, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 226 days.

(21) Appl. No.: 17/550,062

(22) Filed: Dec. 14, 2021

(65) Prior Publication Data
US 2023/0046783 A1 Feb. 16, 2023

(30) Foreign Application Priority Data
Aug. 16, 2021 (JP) ................. 2021-132286

(51) Int. Cl.
*H01L 23/535* (2006.01)
*H01L 23/532* (2006.01)
*H10B 41/27* (2023.01)
*H10B 43/27* (2023.01)

(52) U.S. Cl.
CPC ...... *H01L 23/535* (2013.01); *H01L 23/53257* (2013.01); *H10B 41/27* (2023.02); *H10B 43/27* (2023.02)

(58) Field of Classification Search
CPC . H01L 23/535; H01L 23/53257; H10B 41/27; H10B 43/27
See application file for complete search history.

(56) References Cited

U.S. PATENT DOCUMENTS 9,793,139 B2 * 10/2017 Sharangpani .......... H10B 12/01
10,566,280 B2    2/2020 Wakatsuki et al.
2009/0163025 A1  6/2009 Humayun et al.
(Continued)

FOREIGN PATENT DOCUMENTS

JP    2015177006 A    10/2015
JP    2019160918 A     9/2019
(Continued)

OTHER PUBLICATIONS

Xie, et al., "Thermally Driven Self-Limiting Atomic Layer Etching of Metallic Tungsten Using WF6 and O2", ACS Applied Materials & Interfaces 10 (10), 9147-9154, 2018.

*Primary Examiner* — Lex H Malsawma
(74) *Attorney, Agent, or Firm* — Holtz, Holtz & Volek PC

(57) ABSTRACT

A semiconductor memory device includes a first insulating layer, a first conductive layer, a first pillar, a second pillar, and a second insulating layer. The first conductive layer contains tungsten. The first conductive layer includes a first sub conductive layer and a second sub conductive layer. The first pillar and the second pillar pass through the first insulating layer and the first conductive layer. The second insulating layer divides the first insulating layer and the first conductive layer. The first sub conductive layer is in contact with the second sub conductive layer and is provided between the second sub conductive layer and the first insulating layer. A fluorine concentration in the first sub conductive layer is lower than that in the second sub conductive layer.

10 Claims, 25 Drawing Sheets

(56) References Cited

U.S. PATENT DOCUMENTS

| | | | |
|---|---|---|---|
| 2015/0262939 A1 | 9/2015 | Sakata | |
| 2016/0351444 A1* | 12/2016 | Schloss | H01L 21/28562 |
| 2017/0125538 A1* | 5/2017 | Sharangpani | H10B 12/00 |
| 2019/0172839 A1* | 6/2019 | Tokuda | H01L 29/7926 |
| 2021/0083057 A1 | 3/2021 | Kitamura | |

FOREIGN PATENT DOCUMENTS

| | | |
|---|---|---|
| JP | 2021038442 A | 3/2021 |
| JP | 2021048239 A | 3/2021 |

\* cited by examiner

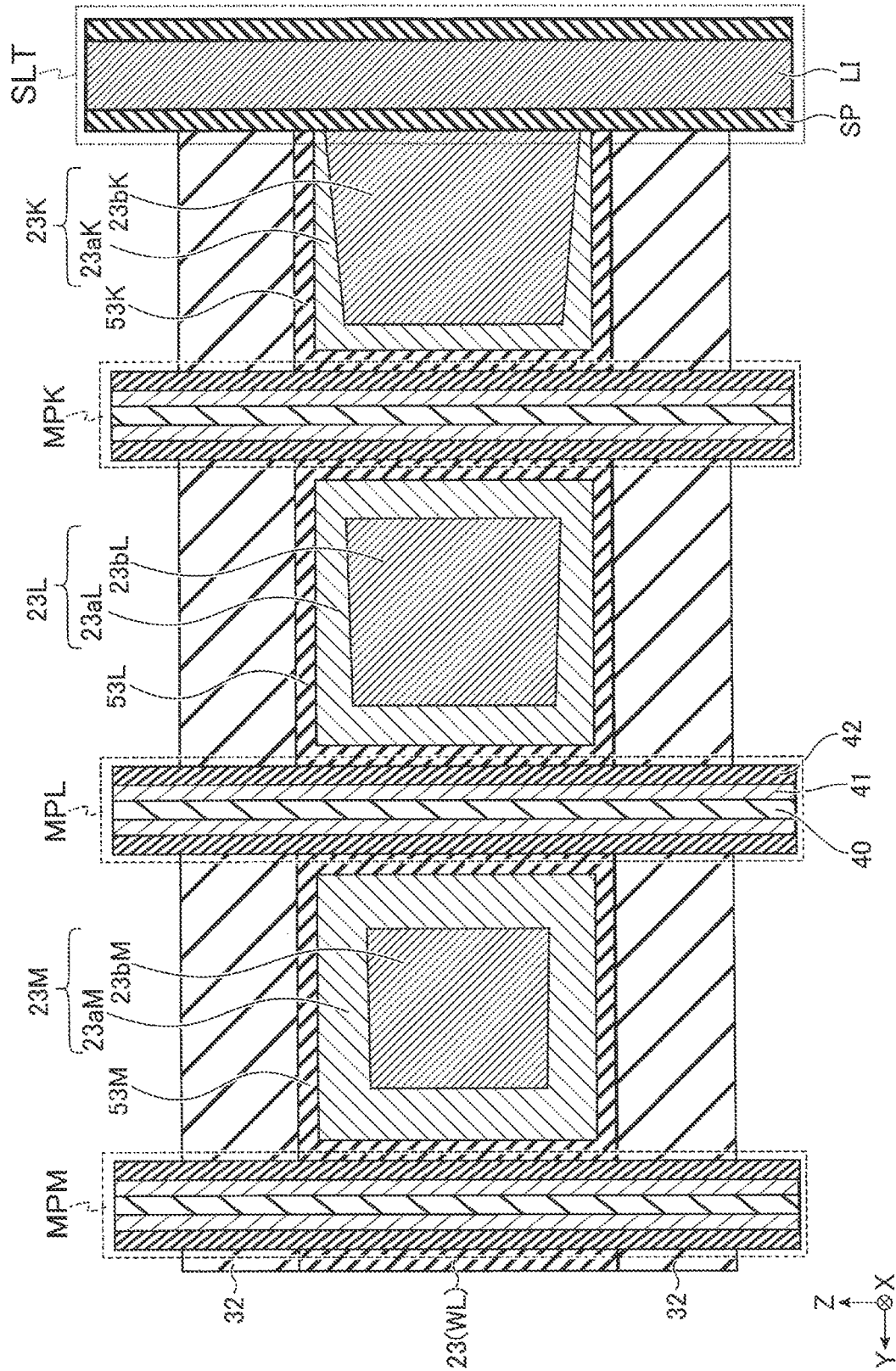
F I G. 6

SEMICONDUCTOR MEMORY DEVICE WITH DIFFERENT FLUORINE CONCENTRATIONS IN SUB CONDUCTIVE LAYERS

CROSS-REFERENCE TO RELATED APPLICATIONS

This application is based upon and claims the benefit of priority from Japanese Patent Application No. 2021-132286, filed Aug. 16, 2021, the entire contents of which are incorporated herein by reference.

FIELD

Embodiments described herein relate generally to a semiconductor memory device and a method for manufacturing a semiconductor memory device.

BACKGROUND

A NAND-type flash memory capable of storing data in a non-volatile manner is known.

BRIEF DESCRIPTION OF THE DRAWINGS

FIG. 6 is a partially enlarged view of the portion including a conductive layer 23 shown in FIG. 4.

DETAILED DESCRIPTION

Figure 1:
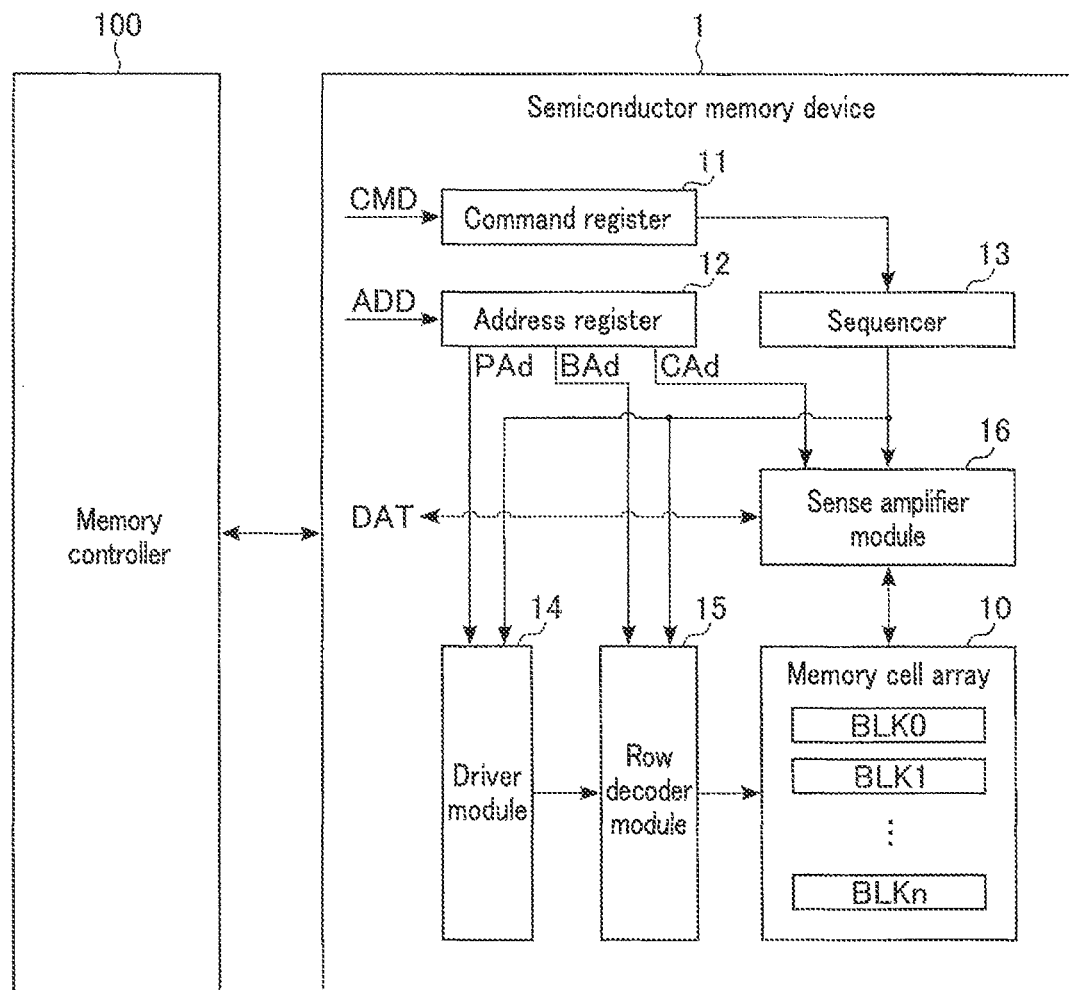
FIG. 1 is a block diagram showing a configuration example of a semiconductor memory device according to a first embodiment.

A semiconductor memory device includes a first insulating layer, a first conductive layer, a first pillar, a second pillar, and a second insulating layer. The first conductive layer is provided above the first insulating layer and contains tungsten. The first conductive layer includes a first sub conductive layer and a second sub conductive layer. The first pillar passes through the first insulating layer and the first conductive layer and extends in a first direction. The second pillar passes through the first insulating layer and the first conductive layer and extends in the first direction. The second insulating layer extends in a second direction and divides the first insulating layer and the first conductive layer. The second direction intersects with the first direction. The first pillar is located between the second insulating layer and the second pillar with respect to a third direction that intersects the first direction and the second direction. The first sub conductive layer is in contact with the second sub conductive layer and is provided between the second sub conductive layer and the first insulating layer. A fluorine concentration in the first sub conductive layer is lower than that in the second sub conductive layer. The first sub conductive layer includes a first portion located between the second insulating layer and the first pillar and a second portion located between the first pillar and the second pillar. A thickness of the first sub conductive layer in the first portion is smaller than that of the first sub conductive layer in the second portion.

Hereinafter, embodiments will be described with reference to the accompanying drawings. Each of the embodiments describes, as an example, a device or method for embodying the technical idea of the embodiments. The drawings are schematic or conceptual, and the dimensions and ratios, etc. in the drawings are not always the same as the actual ones. The entire description of an embodiment is applicable to other embodiments, unless otherwise expressly or implicitly excluded. The technical idea of the present embodiment is not specified by the shapes, structures, arrangements, etc. of structural components.

In the following description, structural components having substantially the same function and configuration will be denoted by the same reference symbol. A numeral following letters constituting a reference symbol is used to distinguish between components referred to by reference symbols including the same letters and having the same configuration. When components having reference symbols containing the same character string need not be distinguished from each other, these components may be referred to by a reference symbol containing the character string only.

[1] FIRST EMBODIMENT

[1-1] Configuration (Structure)

Hereinafter, a semiconductor memory device 1 according to an embodiment will be described.

[1-1-1] Configuration of Semiconductor Memory Device 1

FIG. 1 shows a configuration example of the semiconductor memory device 1 according to the first embodiment. The semiconductor memory device 1 is a NAND flash memory, capable of storing data in a non-volatile manner. The semiconductor memory device 1 is controlled by, for example, an external memory controller 100.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer not less than 1). Each block BLK includes a set of memory cell transistors MT (not shown) capable of storing data in a non-volatile manner, and is used as, for example, a unit of data erasure. A plurality of source lines SL, word lines WL, and bit lines BL (not shown) are coupled to the memory cell array 10. Each memory cell transistor is associated with, for example, a single bit line BL and a single word line WL. The structure of the memory cell array 10 will be discussed later in detail.

The command register 11 retains a command CMD received by the semiconductor memory device 1 from the memory controller 100. The command CMD includes, for example, an instruction for causing the sequencer 13 to execute a read operation, a write operation, an erase operation, etc.

The address register 12 stores address information ADD received by the semiconductor memory device 1 from the memory controller 100. The address information ADD contains, for example, a block address BAd, a page address PAd, and a column address CAd. The block address BAd, the page address PAd, and the column address CAd are used to respectively select, for example, a block BLK, a word line WL, and a bit line BL.

The sequencer 13 controls the overall operation of the semiconductor memory device 1. For example, the sequencer 13 controls the driver module 14, the row decoder module 15, and the sense amplifier module 16, and the like based on the command CMD retained in the command register 11, to execute a read operation, a write operation, an erase operation, and the like.

The driver module 14 generates a voltage to be used in a read operation, a write operation, an erase operation, etc., and supplies the generated voltage to the row decoder module 15. Based on, for example, the page address PAd retained in the address register 12, the driver module 14 applies the generated voltage to a signal line corresponding to a selected word line WL.

The row decoder module 15 selects one block BLK in the memory cell array 10, based on a block address BAd held in the address register 12. Thereafter, the row decoder module 15 transfers, for example, the voltage applied to the signal line coupled to the selected word line WL to the selected word line WL in the selected block BLK.

In a write operation, the sense amplifier module 16 applies, to each bit line BL, a voltage determined in accordance with write data DAT received from the memory controller 100. In a read operation, the sense amplifier module 16 determines data stored in a memory cell transistor MT based on the voltage of the bit line BL, and transfers the result of the determination to the memory controller 100 as read data DAT.

The above-described semiconductor memory device 1 and memory controller 100 may be combined into a single semiconductor device. Examples of such semiconductor devices include a memory card such as an SDm card, and a solid state drive (SSD).

[1-1-2] Circuit Configuration of Memory Cell Array 10

Figure 2:
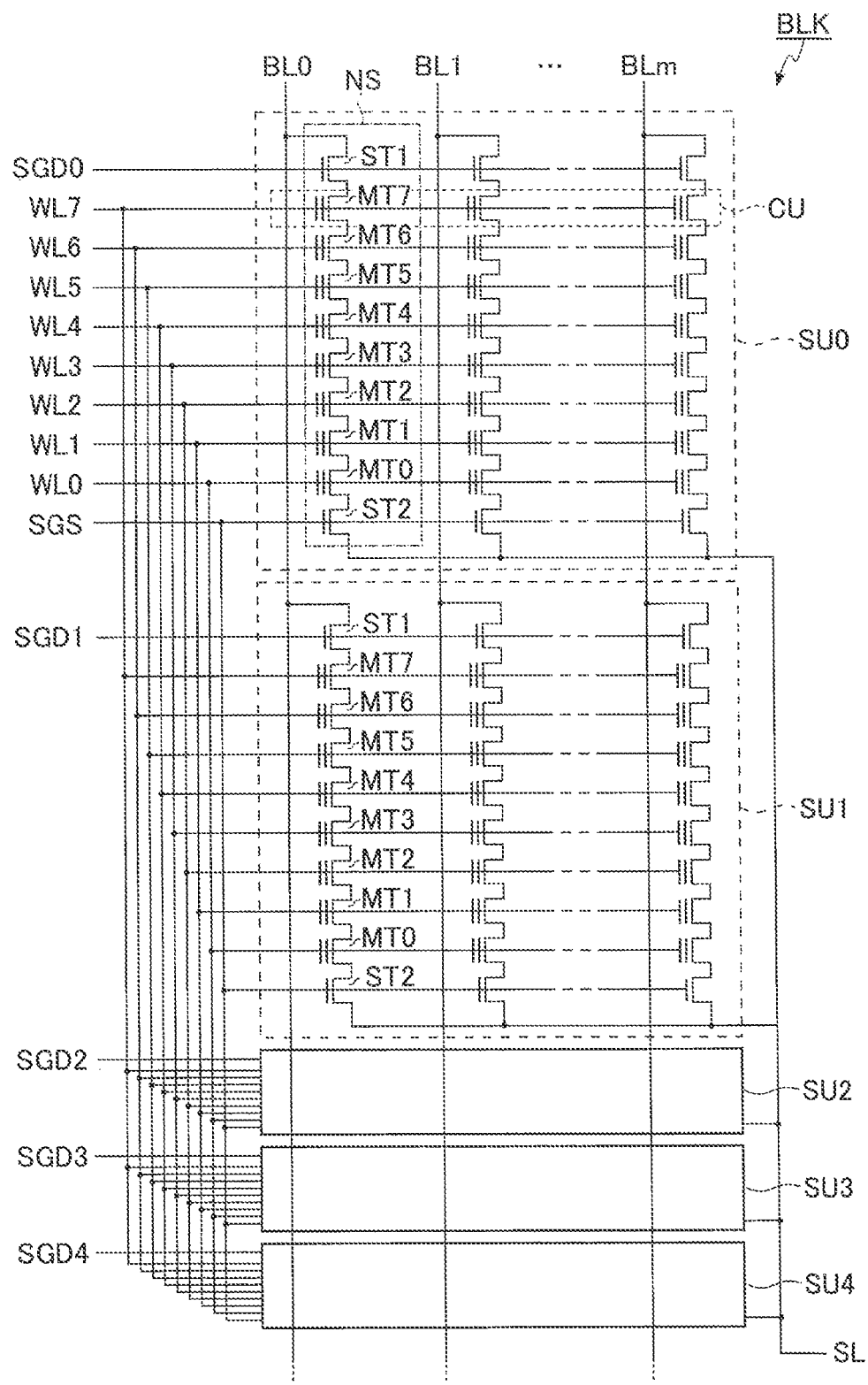
FIG. 2 is a circuit diagram showing an example of the circuit configuration of a memory cell array included in the semiconductor memory device according to the first embodiment.

FIG. 2 is a circuit diagram showing an example of a circuit structure of a memory cell array included in the semiconductor memory device according to the first embodiment. FIG. 2 shows one block BLK of a plurality of blocks BLK included in the memory cell array 10. All the other blocks BLK are configured of the same components and connections as those shown in FIG. 2. The number of blocks BLK in the memory cell array 10 and the number of string units SU in each block BLK may be set to any number. The description hereinafter is based on an example in which one block BLK includes five string units SU0 to SU4.

Each string unit SU is a set of NAND strings NS that are respectively associated with bit lines BL0 to BLm (where m is an integer not less than 1). Each NAND string NS includes, for example, memory cell transistors, for example memory cell transistors MT0 to MT7, and select transistors ST1 and ST2. The description hereinafter is based on an example in which each NAND string NS includes eight memory cell transistors MT0 to MT7.

Each memory cell transistor MT includes a control gate and a charge storage layer, and stores data in a non-volatile manner. Each of the select transistors ST1 and ST2 is used to select a string unit SU at the time of performing various operations.

In each NAND string NS, memory cell transistors MT0 to MT7 are coupled in series. A drain of the select transistor ST1 is coupled to a corresponding bit line BL, and a source of the select transistor ST1 is coupled to one end of a set of memory cell transistors MT0 to MT7. The other end of the set of memory cell transistors MT0 to MT7 is coupled to the drain of select transistor ST2. The source of the select transistor ST2 is coupled to the source line SL.

The control gates of sets of the memory cell transistors MT0 to MT7 in the same block BLK are respectively coupled to the word lines WL0 to WL7. The gate of the select transistor ST1 in each of the string units SU0 to SU4 is coupled to each of the select gate lines SGD0 to SGD3. Gates of the select transistors ST2 are commonly coupled to a select gate line SGS.

Different column addresses are respectively assigned to the bit lines BL0 to BLm. The bit line BL is shared among NAND strings NS in different blocks BLK to which the same column address is assigned. A set of word lines WL0 to WL7 is provided for each block BLK. The source line SL is shared among a plurality of blocks BLK, for example.

A set of memory cell transistors MT coupled to a common word line WL in a single string unit SU is referred to as, for example, a cell unit CU. The storage capacity of a cell unit CU including the memory cell transistors MT, which each stores, for example, 1-bit data, is defined as "1-page data". The cell unit CU can have a storage capacity of 2-page data or more in accordance with the number of bits of data stored in the memory cell transistors MT.

The circuit configuration of the memory cell array 10 included in the semiconductor memory device 1 according to the first embodiment is not limited to the above-described one. For example, the number of the memory cell transistors MT and the number of the select transistors ST1 and ST2 included in each NAND string NS may be determined as appropriate.

[1-1-3] Planar Structure of Memory Cell Array 10

An exemplary structure of the memory cell array 10 in the semiconductor memory device 1 according to the first embodiment will be described hereinafter. In the explanation hereinafter, an orthogonal coordinate system consisting of an X axis, a Y axis, and a Z axis is used. In the plan views, hatching is added as appropriate to facilitate visualization of the drawings. The hatching added to the plan views, however, may not necessarily relate to the materials or properties of the hatched structural components. In the cross-sectional views, constituent elements such as insulating layers (interlayer insulating films), interconnects, contacts, and the like are omitted as appropriate, for improved visibility.

Figure 3:
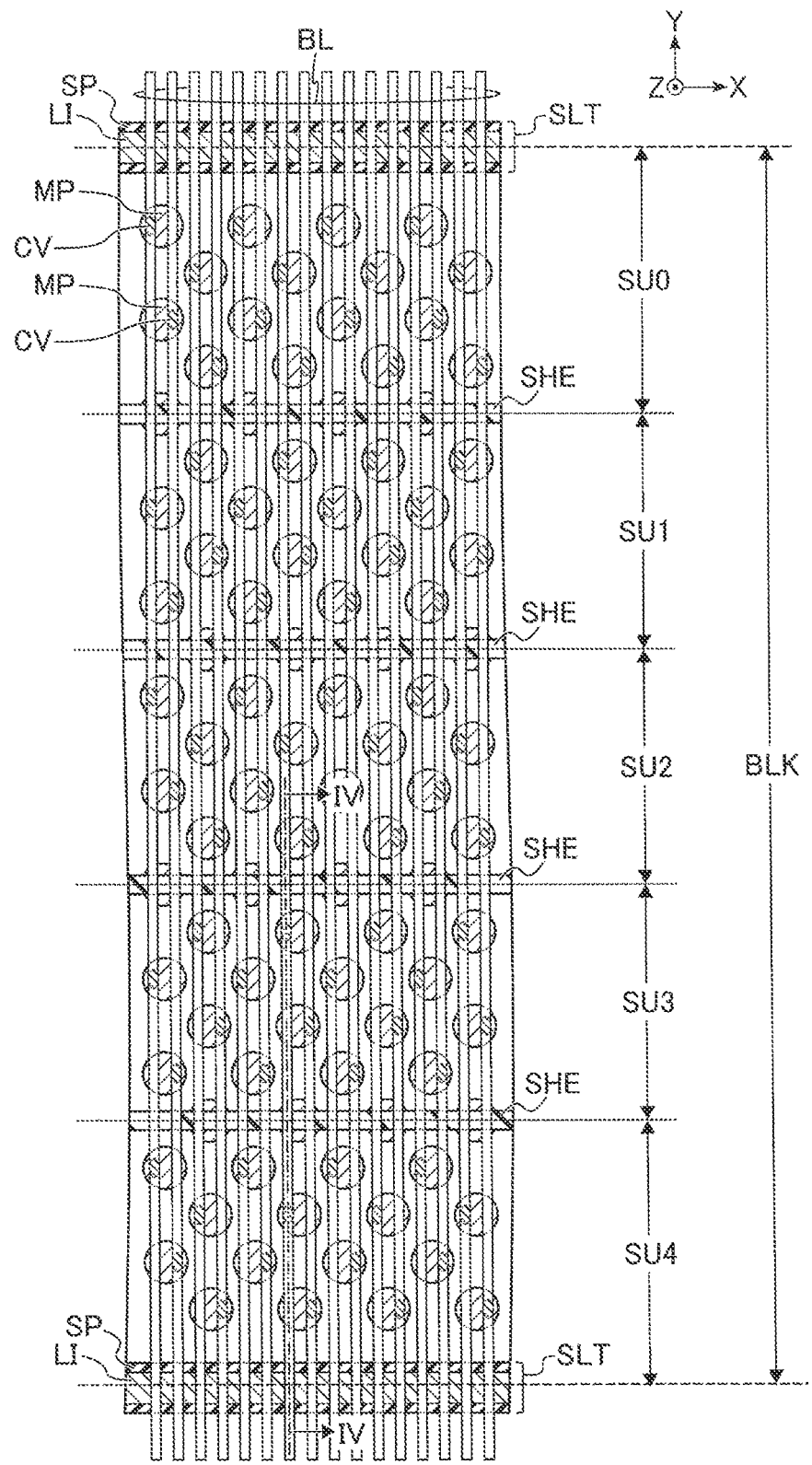
FIG. 3 is a plan view showing an example of a plan layout of the memory cell array 10 included in the semiconductor memory device 1 according to the first embodiment.

FIG. 3 is a plan view showing an example of a plan layout of the memory cell array 10 included in the semiconductor memory device 1 according to the first embodiment. FIG. 3 shows an area that includes a single block BLK, namely string units SU0 to SU4. As shown in FIG. 3, the memory cell array 10 includes a plurality of memory pillars MP, a plurality of contacts CV, a plurality of members SLT and SHE, and a plurality of bit lines BL.

The plurality of members SLT extend along the X axis and are arranged along the Y axis. Each member SLT includes a contact LI and a spacer SP. The contact LI is a conductor spanning across the XZ plane. The spacer SP is an insulator that is provided on a side surface of the contact LI. In other words, the contact LI is surrounded by the spacer SP in a planar view. Each member SLT divides stacked interconnects that are adjacent to each other with the member SLT interposed therebetween.

The plurality of members SHE extend along the X axis and are arranged along the Y axis. In this example, four members SHE are arranged between adjacent members SLT. Each member SHE has, for example, a structure into which an insulator is embedded. Each member SHE divides select gate lines SGD (described later) that are adjacent to each other with the member SHE interposed therebetween.

In the above-described plan layout of the memory cell array 10, each of the areas partitioned by the members SLT functions as one block BLK. Furthermore, the area partitioned by the members SLT and SHE and the area partitioned by SHE and SHE respectively function as a single string unit SU. Specifically, SHE is arranged between string units SU0 and SU1 adjacent to each other in the Y direction, between SU1 and SU2, between SU2 and SU3, and between SU3 and SU4, respectively. In the memory cell array 10, a layout similar to the one shown in FIG. 3 for example is repeated in the Y direction.

The plan layout of the memory cell array 10 included in the semiconductor memory device 1 according to the first embodiment is not limited to the above-described layout. For example, the number of members SHE arranged between adjacent members SLT may be designed to be any number. The number of string units SU formed between adjacent members SLT may be changed based on the number of the members SHE arranged between adjacent members SLT.

The memory pillars MP are in, for example, a 24-row staggered arrangement in an area between two adjacent members SLT. The memory pillars MP in the fifth row, the memory pillars MP in the tenth row, the memory pillars MP in the fifteenth row, and the memory pillars MP in the twentieth row, counting from the top of the drawing (the +Y side), for example, overlap a single member SHE. The number and arrangement of the memory pillars MP between adjacent members SLT is not limited to this example but may be suitably changeable. Each memory pillar MP functions as, for example, a single NAND string NS.

The bit lines BL extend along the Y axis and are aligned in the X axis. Each bit line BL is arranged so as to overlap at least one memory pillar MP in each string unit SU. The example of FIG. 3 shows a case where two bit lines BL are arranged so as to overlap a single memory pillar MP. A contact CV is provided between a memory pillar MP and one of the bit lines BL that overlap the memory pillar MP. Each memory pillar MP is coupled to a single bit line BL via a contact plug CV. One contact CV is coupled to one bit line BL in each space partitioned by the members SLT or the members SHE.

For example, a contact CV is omitted between a memory pillar MP in contact with the members SHE and a bit line BL. In other words, a contact CV is omitted between a memory pillar MP in contact with two different select gate lines SGD and a bit line BL. The number and arrangement of the memory pillars MP and those of the members SHE, etc. between adjacent members SLT are not limited to the configuration described with reference to FIG. 3, and may be suitably changed. The number of bit lines BL that overlap each memory pillar MP can be freely designed.

[1-1-4] Cross-sectional Structure of Memory Cell Array 10

Figure 4:
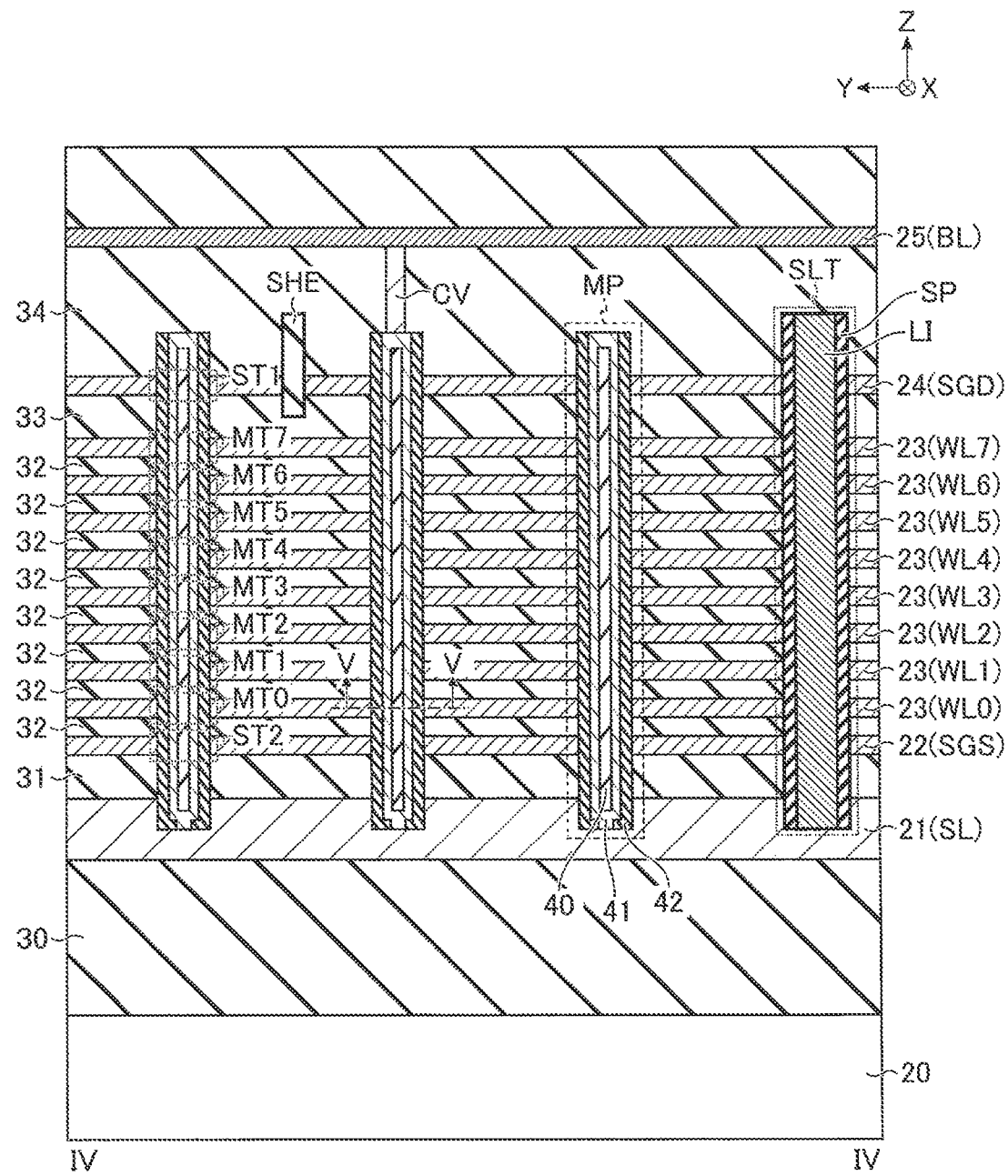
FIG. 4 is a cross-sectional view taken along line IV-IV of FIG. 3, showing an example of a cross-sectional structure of the memory cell array 10 of the semiconductor memory device 1 according to the first embodiment.

FIG. 4 is a cross-sectional view taken along line IV-IV of FIG. 3, showing an example of a cross-sectional structure of the semiconductor memory device 10 according to the first embodiment. As shown in FIG. 4, the memory cell array 10 further includes a semiconductor substrate 20, conductive layers 21 to 25, and insulating layers 30 to 34.

The insulating layer 30 is provided above the semiconductor substrate 20. The insulating layer 30 contains, for example, silicon oxide ($SiO_2$). Although illustration is omitted, a circuit area UA is provided in a part of the semiconductor substrate 20 and in the insulating layer 30, and a memory cell array 10 is provided on the insulating layer 30. In the circuit area UA, circuits such as the row decoder module 15 or the sense amplifier module 16, etc., are provided.

The conductive layer 21 is provided above the insulating layer 30. The conductive layer 21 is formed in, for example, a plate-like shape extending along the XY plane, and is used as a source line SL. The conductive layer 21 is an N-type semiconductor, for example. The conductive layer 21 contains phosphorus (P)-doped silicon (Si), or a metal material, or the like, for example.

The insulating layer 31 is provided on the conductive layer 21. The conductive layer 22 is provided on the insulating layer 31. The conductive layers 22 are formed, for example, in a plate shape extending along the XY plane. The conductive layer 22 is used as the select gate line SGS. The conductive layer 22 contains tungsten (W) for example. The details of the conductive layer 22 will be described later with reference to FIG. 6.

The insulating layers 32 and the conductive layers 23 are alternately stacked above the conductive layer 22. The conductive layer 23 has a plate-like shape expanding along the XY plane for example. The stacked conductive layers 23 are, in the order from the side of the semiconductor substrate 20, used as word lines WL0 to WL7. The conductive layer 23 contains, for example, tungsten. The details of the conductive layer 23 will be described later with reference to FIG. 6.

The insulating layer 33 is provided on the uppermost conductive layer 23. The conductive layer 24 is provided on the insulating layer 33. The conductive layer 24 is formed in, for example, a plate-like shape extending in the XY plane, and is used as a select gate line SGD. The conductive layer 24 contains, for example, tungsten. The details of the conductive layer 24 will be described later with reference to FIG. 6.

The insulating layer 34 is provided on the conductive layer 24. The conductive layer 25 is provided on the insulating layer 34. The conductive layer 25 may be formed into a line extending in the Y direction, and is used as a bit line BL. Thus, the plurality of conductive layers 25 are aligned along the X axis in the area not shown in the drawings. The conductive layer 25 includes, for example, copper (Cu).

Each of the memory pillars MP extends in the Z axis, penetrating the insulating layers 31 to 33 and the conductive layers 22 to 24. The upper end of the memory pillar MP is in located inside the insulating layer 34. The lower end of the memory pillar MP is located inside the conductive layer 21.

Each memory pillar MP includes, for example, a core member 40, a semiconductive layer 41, and a stacked film 42. The core member 40 extends along the Z axis and is arranged at the center of the memory pillar MP. For example, the upper end of the core member 40 reaches a layer above the layer in which conductive layer 24 is provided. The lower end of the core member 40 reaches the conductive layer 21. The core member 40 includes an insulator, such as silicon oxide.

The semiconductive layer 41 covers, for example, the periphery of the core member 40. For example, the bottom surface of the semiconductive layer 41 is in contact with the conductive layer 21. The semiconductive layer 41 includes silicon, for example.

The stacked film 42 covers the side surface and the bottom surface of the semiconductive layer 41, except for the portions at which the semiconductive layer 41 and the conductive layer 21 are in contact with each other. The details of the stacked film 42 will be described later with reference to FIG. 5.

In the above described structure of the memory pillar MP, the intersecting part of the memory pillar MP and the conductive layer 22 functions as the select transistor ST2. The portion at which the memory pillar MP and one conductive layer 23 intersect each other functions as one memory cell transistor MT. The portion where the memory pillar MP intersects conductive layer 24 functions as select transistor ST1.

The member SLT includes, for example, a portion provided along the XZ plane, and divides the conductive layers 22 to 24. The contact LI in the member SLT is provided along the member SLT. A portion of the top end of the contact LI is in contact with the insulating layer 34. The bottom end of the contact LI is in contact with the conductive layer 21. The contact LI is used as, for example, part of the source line SL. The spacer SP is provided at least between the contact LI and the conductive layers 22 to 24. The contact LI and the conductive layers 22 to 24 are distanced and insulated by the spacer SP.

The member SHE includes, for example, a portion provided along the XZ plane, and divides at least the conductive layer 24. The top end of the member SHE is in contact with the insulating layer 34. The bottom end of the member SHE is in contact with the insulating layer 33. The member SHE includes an insulator, such as silicon oxide. The top end of the member SHE may be designed to be aligned or unaligned with the top end of the member SLT. The top end of the member SHE and the top end of the memory pillar MP may be either aligned or not aligned.

A pillar-shaped contact CV is provided on the upper surface of the semiconductive layer 41 in the memory pillar MP. In the illustrated area, a contact CV coupled to one of the three memory pillars MP is shown. To the memory pillars MP not overlapping a member SHE and not coupled to a contact CV in the area illustrated in the drawing, a contact CV is coupled in an area not illustrated in the drawing.

A top surface of the contact CV is in contact with one of the conductive layers 25, namely, one of the bit lines BL. In each space sectioned by the members SLT and SHE, one contact CV is coupled to a single conductive layer 25. That is, the memory pillar MP arranged between any adjacent members SLT and SHE and the memory pillar MP arranged between any two adjacent members SHE are electrically coupled to each conductive layer 25.

Figure 5:
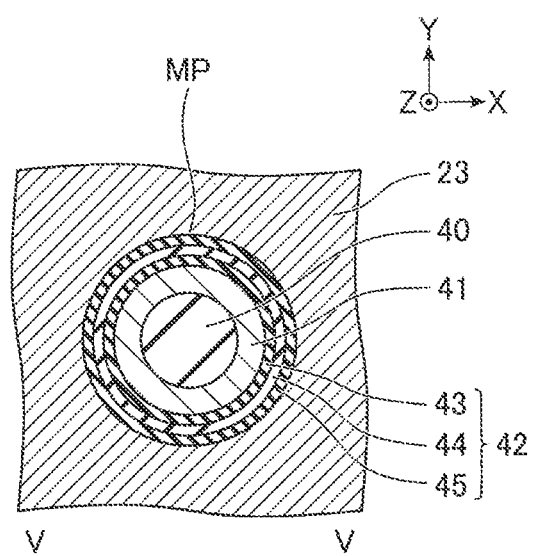
FIG. 5 is a cross-sectional view, taken along line V-V in FIG. 4, showing an example of a cross-sectional structure of a memory pillar MP in the semiconductor memory device 1 according to the first embodiment.

FIG. 5 is a cross-sectional view, taken along line V-V in FIG. 4, showing an example of a cross-sectional structure of the memory pillar MP in the semiconductor memory device 1 according to the first embodiment. Specifically, FIG. 5 shows a cross-sectional structure of the memory pillar MP in a layer parallel to the surface of the semiconductor substrate 20 and including the conductive layer 23. As shown in FIG. 5, the stacked film 42 includes, for example, a tunnel insulating film 43, an insulating film 44, and a first block insulating film 45.

In the cross section including the conductive layer 23, the core member 40 is provided in the middle of the memory pillar MP. The semiconductive layer 41 surrounds the side surface of the core member 40. The tunnel insulating film 43 surrounds a side surface of the semiconductive layer 41. The insulating film 44 surrounds the side surface of the tunnel insulating film 43. The first block insulating film 45 surrounds the side surface of the insulating film 44. The conductive layer 23 surrounds the side surface of the first block insulating film 45. Each of the tunnel insulating film 43 and the first block insulating film 45 contains, for example, silicon oxide. The insulating film 44 contains, for example, silicon nitride.

In the above-described memory pillar MP, the semiconductive layer 41 is used as a channel (current path) for each of the memory cell transistors MT0 to MT7 and the select transistors ST1 and ST2. The insulating film 44 is used as the charge storage layer of the memory cell transistor MT. The semiconductor memory device 1 is able to let a current flow between a bit line BL and a contact LI via a memory pillar MP by turning on the memory cell transistors MT0 through MT7 and the select transistors ST1 and ST2. Each memory pillar MP thereby functions as a single NAND string NS.

FIG. 6 is a partially enlarged view of the portion including a conductive layer 23 shown in FIG. 4. The structure of the conductive layer 23 is further explained with reference to FIG. 6. Hereinafter, the three illustrated memory pillars MP may be respectively referred to as a "memory pillar MPK", a "memory pillar MPL", and a "memory pillar MPM", in order of closeness to the member SLT. In the conductive layer 23, a portion interposed between the member SLT and the memory pillar MPK may be referred to as a "conductive layer 23K" hereinafter. In the conductive layer 23, a portion interposed between the memory pillar MPK and the memory pillar MPL may be referred to as a "conductive layer 23L,"

hereinafter. In the conductive layer 23, a portion interposed between the memory pillar MPL and the memory pillar MPM may be referred to as a "conductive layer 23M" hereinafter. Similarly, the structural elements in the area interposed between the member SLT and the memory pillar MPK may have a "K" added at the end of their reference symbols. The structural elements in the area interposed between the member MPK and the memory pillar MPL may have an "L" added at the end of their reference numbers. The structural elements in the area interposed between the member MPL and the memory pillar MPM may have an "M" added at the end of their reference numbers.

The conductive layers 23 are formed between the insulating layers 32. Although illustration is omitted in FIG. 3, a second block insulating film 53 is formed between the insulating layer 32 and the conductive layer 23. The conductive layers 23 have a multilayered structure. The conductive layer 23 includes conductive layers 23a (23aK, 23aL, and 23aM) and conductive layers 23b (23bK, 23bL, and 23bM). In other words, the conductive layer 23K includes the conductive layer 23aK and the conductive layer 23bK. The conductive layer 23L includes the conductive layer 23aL and conductive layer 23bL. The conductive layer 23M includes the conductive layer 23aM and conductive layer 23bM.

The conductive layer 23b is formed in a plate-like shape expanding along the XY plane for example, and is provided inside of the conductive layer 23. The conductive layer 23a surrounds the surface of the conductive layer 23b. The second block insulating film 53 surrounds the surface of the conductive layer 23a. A portion of the top and bottom surfaces of the second block insulating film 53 is in contact with the insulating layer 32. In a portion of the side surface of the memory pillar MP, the second block insulating film 53 is in contact with the first block insulating film 45.

The conductive structure 23b contains tungsten (W) and fluorine (F), for example. The concentration of fluorine contained in the conductive layer 23b is not necessarily uniform over the entire conductive layer 23b.

The conductive structure 23a contains tungsten (W) and oxygen (O), for example. The materials that constitute the conductive layer 23b and the conductive layer 23a are both mainly tungsten but they differ in their fluorine content. The content of fluorine in the conductive layer 23b is greater than that in the conductive layer 23a. Ideally, the conductive layer 23a does not contain fluorine at the time when formed; however, after the conductive layer 23a undergoes subsequent manufacturing steps, some of the fluorine contained in the conductive layer 23b may diffuse into the conductive layer 23a. Even in this case, an amount of fluorine contained in the conductive layer 23b is greater than that in the conductive layer 23a. At this time, the fluorine concentration in the conductive layer 23a is high in the area close to the conductive layer 23b and low in the area far therefrom.

The conductive layer 23a has a role of preventing diffusion of fluorine contained in the conductive layer 23b into the insulating layer 32 and the first block insulating film 45 beyond the conductive layer 23a and the second block insulating film 53.

The second block insulating film 53 (53K, 53L, and 53M) contains aluminum oxide, for example. The second block insulating film 53 contains a material having a high dielectric constant and functions as a block insulating film. The second block insulating films 53K, 53L, and 53M are formed with or without an approximately uniform thickness.

Herein, the second block insulating film 53 may be omitted. In this case, the conductive layer 23a is in contact with the insulating layer 32.

The conductive layer 23a located closer to the member SLT is formed thinner than the one located far from the member SLT. Specifically, an average of the thickness of the conductive layer 23aK is smaller than that of the conductive layer 23aL. An average of the thickness of the conductive layer 23aL is smaller than that of the conductive layer 23aM. The thickness of the conductive layer 23a is a length between the second block insulating film 53 and the conductive layer 23b in the YZ plane.

The conductive layer 23a located closer to the member SLT has a portion in which the thickness is smaller than that of the conductive layer 23a located far from the member SLIT. Specifically, the conductive layer 23aK has a portion in which the thickness is smaller than that of the conductive layer 23aL. The conductive layer 23aK may have a portion in which the thickness is the same as or larger than that of the conductive layer 23aL. The conductive layer 23aL has a portion in which the thickness is smaller than that of the conductive layer 23aM. The conductive layer 23aL may have a portion in which the thickness is the same as or larger than that of the conductive layer 23aM. It suffices that the conductive layer 23aK has a thickness that prevents diffusion of fluorine contained in the conductive layer 23bK into the insulating layer 32 and the first block insulating film 45 beyond the conductive layer 23aK and the second block insulating film 53K.

The conductive layer 23b located closer to the member SLT is formed thicker than the one located far from the member SLT. Specifically, an average of the thickness of the conductive layer 23bK is larger than that of the conductive layer 23bL. An average of the thickness of the conductive layer 23bL is larger than that of the conductive layer 23bM. The thickness of the conductive layer 23b is a thickness in the Y direction or Z direction of the conductive layer 23b.

The F concentration of the conductive layer 23 is higher in the conductive layer 23 located closer to the member SLT than in the one located far from the member SLT. Specifically, the F concentration of the conductive layer 23K is higher than that of the conductive layer 23L. The F concentration of the conductive layer 23L is higher than that of the conductive layer 23M.

The conductive layers 22 and 24 also have a structure similar to that of the conductive layer 23 illustrated in FIG. 6.

The conductive layer 24 (24K, 24L, and 24M) is formed between the insulating layer 33 and the insulating layer 34. Although illustration is omitted in FIG. 3, the second block insulating film 54 is formed between the insulating layer 33 or the insulating layer 34 and the conductive layer 24. The conductive layer 24 has a multilayered structure. The conductive layer 24 includes conductive layers 24a (24aK, 24aL, and 24aM) and conductive layers 24b (24bK, 24bL, and 24bM).

The second block insulating film 54 (54K, 54L, 54M), the conductive layer 24a, and the conductive layer 24b are similar to the second block insulating film 53, the conductive layer 23a, and the conductive layer 23b, respectively. For this reason, the matters regarding the second block insulating film 53, the conductive layer 23a, and the conductive layer 23b are applicable to the second block insulating film 54, the conductive layer 24a, and the conductive layer 24b, and detailed explanation is omitted, except for the matters explained hereinafter.

The second block insulating films 54K, 54L, and 54M are formed with or without an approximately uniform thickness.

The conductive layer 24a located closer to the member SLT is formed thinner than the one located far from the member SLT. Specifically, an average of the thickness of the conductive layer 24aK is smaller than that of the conductive layer 24aL. An average of the thickness of the conductive layer 24aL is smaller than that of the conductive layer 24aM. The thickness of the conductive layer 24a is a length between the second block insulating film 54 and the conductive layer 24b in the YZ plane.

The conductive layer 24a located on the side closer to the member SLT has a portion in which the thickness is smaller than that of the conductive layer 24a located on the side far from the member SLT. Specifically, the conductive layer 24aK has a portion in which the thickness is smaller than that of the conductive layer 24aL. The conductive layer 24aK may have a portion in which the thickness is the same as or larger than that of the conductive layer 24aL. The conductive layer 24aL has a portion in which the thickness is smaller than that of the conductive layer 24aM. The conductive layer 24aL may have a portion in which the thickness is the same as or larger than that of the conductive layer 24aM.

It suffices that the conductive layer 24aK has a thickness that prevents diffusion of fluorine contained in the conductive layer 24bK into the insulating layer 33, the insulating layer 34, and the first block insulating film 45 beyond the conductive layer 24aK and the second block insulating film 54K.

The conductive layer 24b located closer to the member SLT is formed thicker than the one located far from the member SLT. Specifically, an average of the thickness of the conductive layer 24bK is larger than that of the conductive layer 24bL. An average of the thickness of the conductive layer 24bL is larger than that of the conductive layer 24bM. The thickness of the conductive layer 24b is a thickness in the Y direction or Z direction of the conductive layer 24b.

The F concentration of the conductive layer 24 is higher in the conductive layer 24 located on the side closer to the member SLT than in the one located on the side far from the member SLT. Specifically, the F concentration of the conductive layer 24K is higher than that of the conductive layer 24L. The F concentration of the conductive layer 24L is higher than that of the conductive layer 24M.

Similarly, the conductive layer 22 (22K, 22L, and 22M) is formed between the insulating layer 31 and the insulating layer 32. Although illustration is omitted in FIG. 3, the second block insulating film 52 is formed between the insulating layer 31 or the insulating layer 32 and the conductive layer 22. The conductive layer 22 has a multilayered structure. The conductive layer 22 includes conductive layers 22a (22aK, 22aL, and 22aM) and conductive layers 22b (22bK, 22bL, and 22bM).

The second block insulating film 52 (52K, 52L, 52M), the conductive layer 22a, and the conductive layer 22b are similar to the second block insulating film 53, the conductive layer 23a, and the conductive layer 23b, respectively. For this reason, the matters regarding the second block insulating film 53, the conductive layer 23a, and the conductive layer 23b are applicable to the second block insulating film 52, the conductive layer 22a, and the conductive layer 22b, and detailed explanation is omitted, except for the matters explained hereinafter.

The second block insulating films 52K, 52L, and 52M are formed with or without an approximately uniform thickness.

The conductive layer 22a located closer to the member SLT is formed thinner than the one located far from the member SLT. Specifically, an average of the thickness of the conductive layer 22aK is smaller than that of the conductive layer 22aL. An average of the thickness of the conductive layer 22aL is smaller than that of the conductive layer 22aM. The thickness of the conductive layer 22a is a length between the second block insulating film 52 and the conductive layer 22b in the YZ plane.

The conductive layer 22a located on the side closer to the member SLT has a portion in which the thickness is smaller than that of the conductive layer 22a located on the side far from the member SLT. Specifically, the conductive layer 22aK has a portion in which the thickness is smaller than that of the conductive layer 22aL. The conductive layer 22aK may have a portion in which the thickness is the same as or larger than that of the conductive layer 22aL. The conductive layer 22aL has a portion in which the thickness is smaller than that of the conductive layer 22aM. The conductive layer 22aL may have a portion in which the thickness is the same as or larger than that of the conductive layer 22aM.

It suffices that the conductive layer 22aK has a thickness that prevents diffusion of fluorine contained in the conductive layer 22bK into the insulating layer 33, the insulating layer 34, and the first block insulating film 45 beyond the conductive layer 22aK and the second block insulating film 52K.

The conductive layer 22b located closer to the member SLT is formed thicker than the one located far from the member SLT. Specifically, an average of the thickness of the conductive layer 22bK is larger than that of the conductive layer 22bL. An average of the thickness of the conductive layer 22bL is larger than that of the conductive layer 22bM. The thickness of the conductive layer 22b is a thickness in the Y direction or Z direction of the conductive layer 22b.

The F concentration of the conductive layer 22 is higher in the conductive layer 22 located on the side closer to the member SLT than in the one located on the side far from the member SLT. Specifically, the F concentration of the conductive layer 22K is higher than that of the conductive layer 22L. The F concentration of the conductive layer 22L is higher than that of the conductive layer 22M.

[1-2] Method of Manufacturing Semiconductor Memory Device 1

Figure 7:
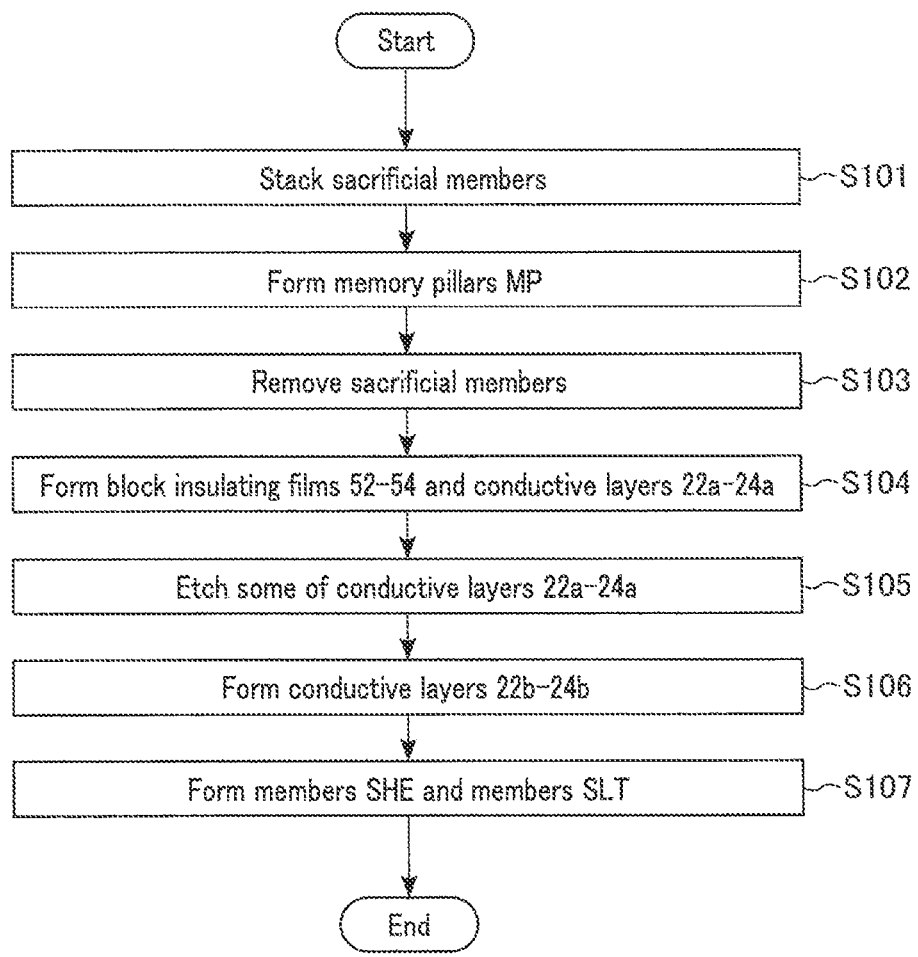
FIG. 7 is a flowchart showing an example of a method of manufacturing the semiconductor memory device 1 according to the first embodiment.

Hereinafter, an example of a series of manufacturing steps related to the formation of a stacked interconnect structure in the memory cell array 10 in the semiconductor memory device 1 according to the first embodiment will be described, with reference to FIG. 7. FIG. 7 is a flowchart showing an example of the method for manufacturing the semiconductor memory device 1 according to the first embodiment. Each of FIGS. 8 to 17 shows an example of a cross-sectional structure of the semiconductor memory device 1 in the course of manufacturing according to the first embodiment. FIGS. 8 to 11, 13, and 15 show the cross sections of the same area as that shown in FIG. 4. FIGS. 12, 14, and 16 show the cross sections of the same area as that shown in FIG. 6.

Figure 8:
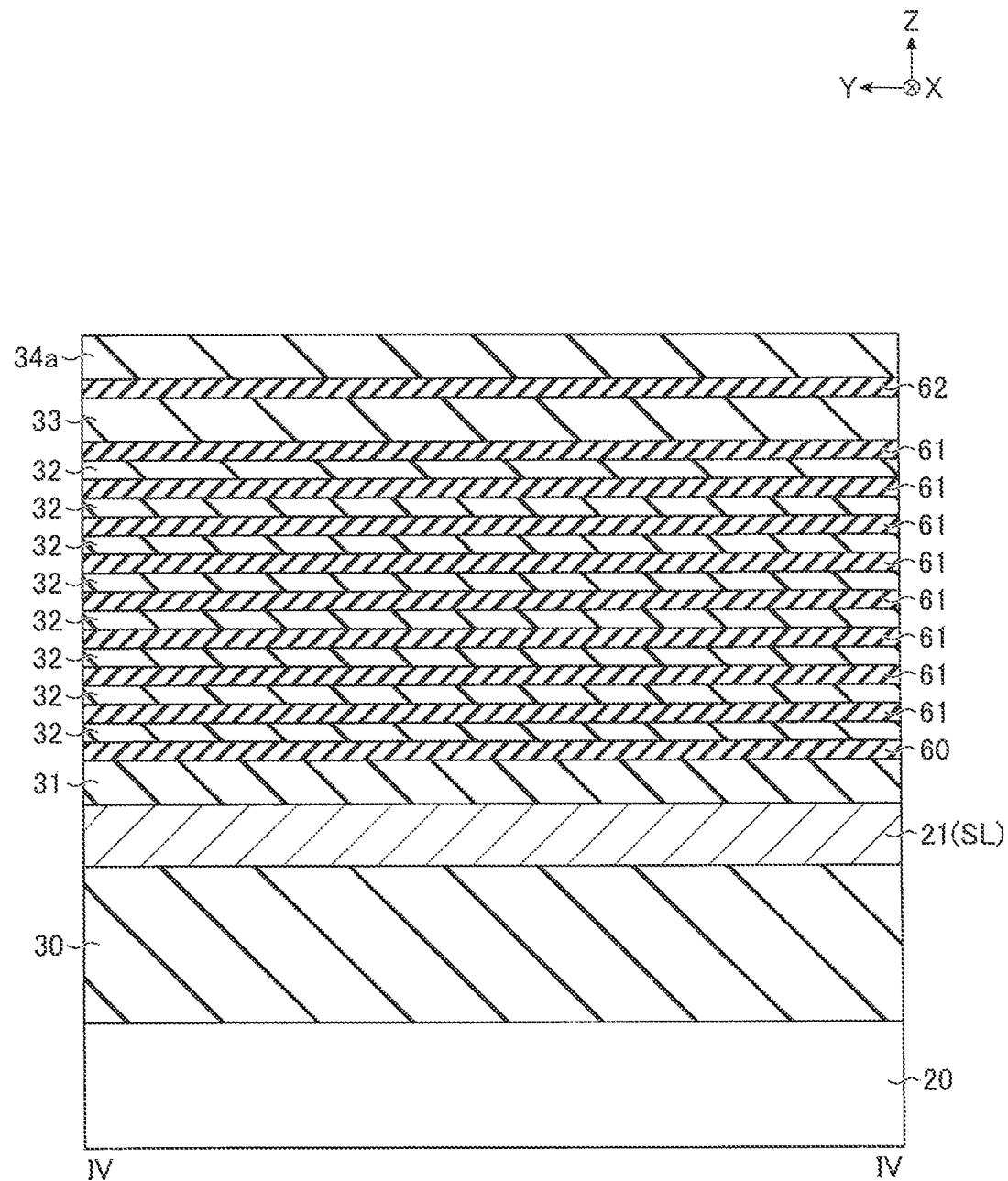
FIGS. 8 to 17 show examples of cross-sectional structures of the semiconductor memory device 1 in the course of manufacturing according to the first embodiment.

As shown in FIG. 8, sacrificial members 60-62 are stacked (step S101). The sacrificial members 60 to 62 are formed respectively in areas in which the conductive layers 22 to 24, which will respectively function as a select gate line SGS, word lines WL, and a select gate line SGD, are slated to be formed. Specifically, an insulating layer 30, a conductive layer 21, an insulating layer 31, and a sacrificial member 60 are sequentially formed on the insulating layer 20 in this order.

Thereafter, an insulating layer 32 and a sacrificial member 61 are then alternately stacked on the sacrificial member 60, and an insulating layer 33 is formed on the topmost sacrificial member 61. A sacrificial member 62 is formed on the insulating layer 33. An insulating layer 34a is formed on the sacrificial member 62. For example, the number of layers of sacrificial members 61 to be formed corresponds to the number of word lines WL.

Each of the insulating layers 30 to 34a contains silicon oxide, for example. The sacrificial members 60 to 62 contain silicon nitride, for example.

Figure 9:
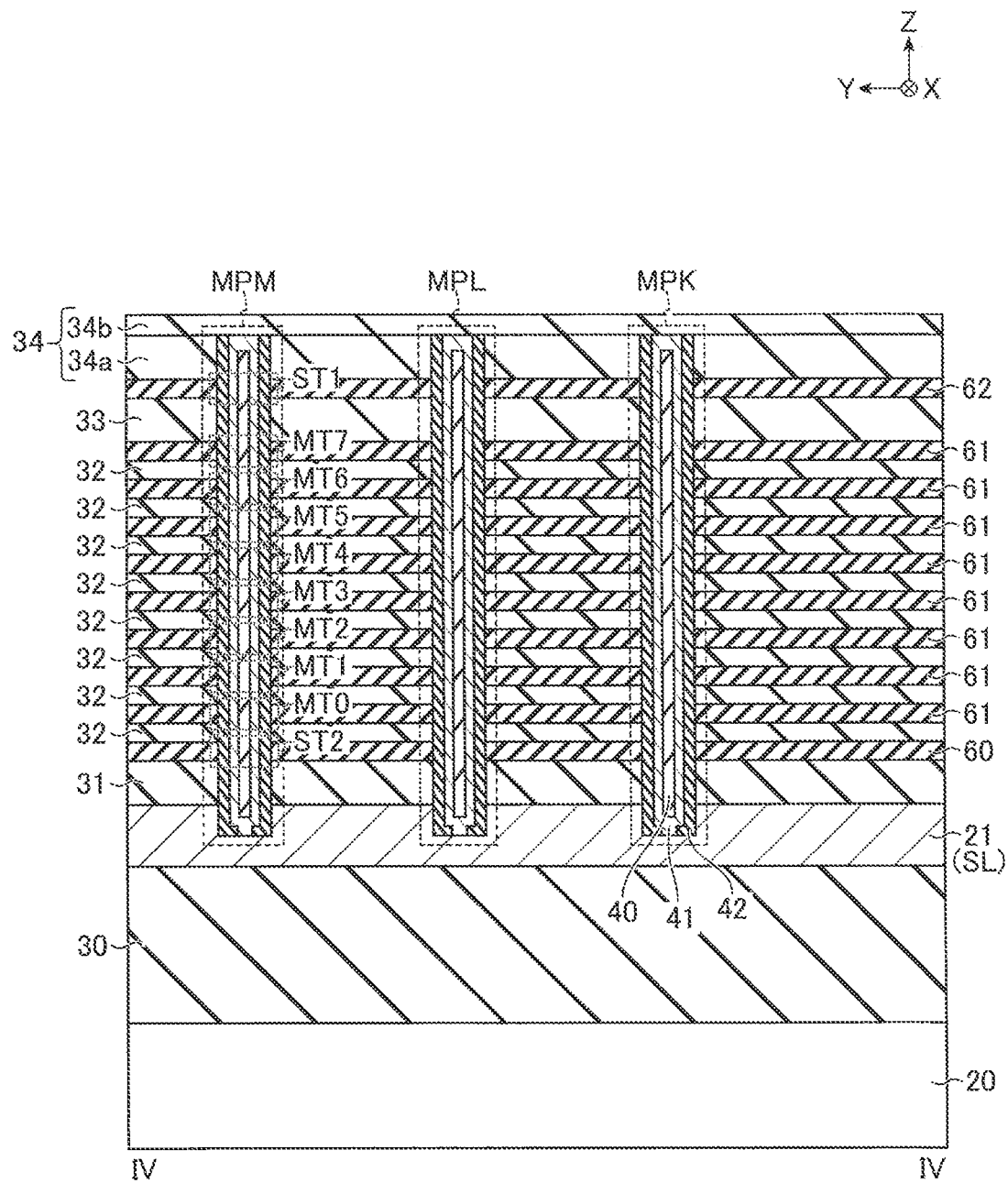

Thereafter, memory pillars MP are formed as shown in FIG. 9 (step S102). Specifically, a mask including openings at areas in which memory pillars MP are slated to be formed is created by, for example, photolithography. Memory holes are formed by anisotropic etching using the created mask. Each memory hole passes through the insulating layers 30 to 34a and the sacrificial members 60 to 62, and the bottom of the memory hole reaches the inside of the conductive layer 21, for example. After that, a stacked film 42 is formed on the side surface and the bottom surface of the memory hole; in other words, the first block insulating film 45, the insulating film 44, and the tunnel insulating film 43 are sequentially formed. Thereafter, the first block insulating film 45, the insulating film 44, and the tunnel insulating film 43 at the bottom of the memory hole are partly removed. Thereafter, the semiconductive layer 41 is formed on the surface of the tunnel insulating film 43 in the memory hole. The semiconductive layer 41 is in contact with the conductive layer 21. Then, the core member 40 is formed and the memory hole is embedded with the core member 40. Thereby, a memory pillar MP is formed.

As described above, the three illustrated memory pillars MP may be respectively referred to as a "memory pillar MPK", a "memory pillar MPL", and a "memory pillar MPM", in order of closeness to the area in which the member SLT is slated to be formed.

Next, the insulating layer 34b is formed on the insulating layer 34a and the upper surface of the memory pillar MP. Hereinafter, the insulating layer consisting of the insulating layer 34a and the insulating layer 34b may be called an "insulating layer 34". The anisotropic etching in this step is, for example, reactive ion etching (RIE).

Figure 10:
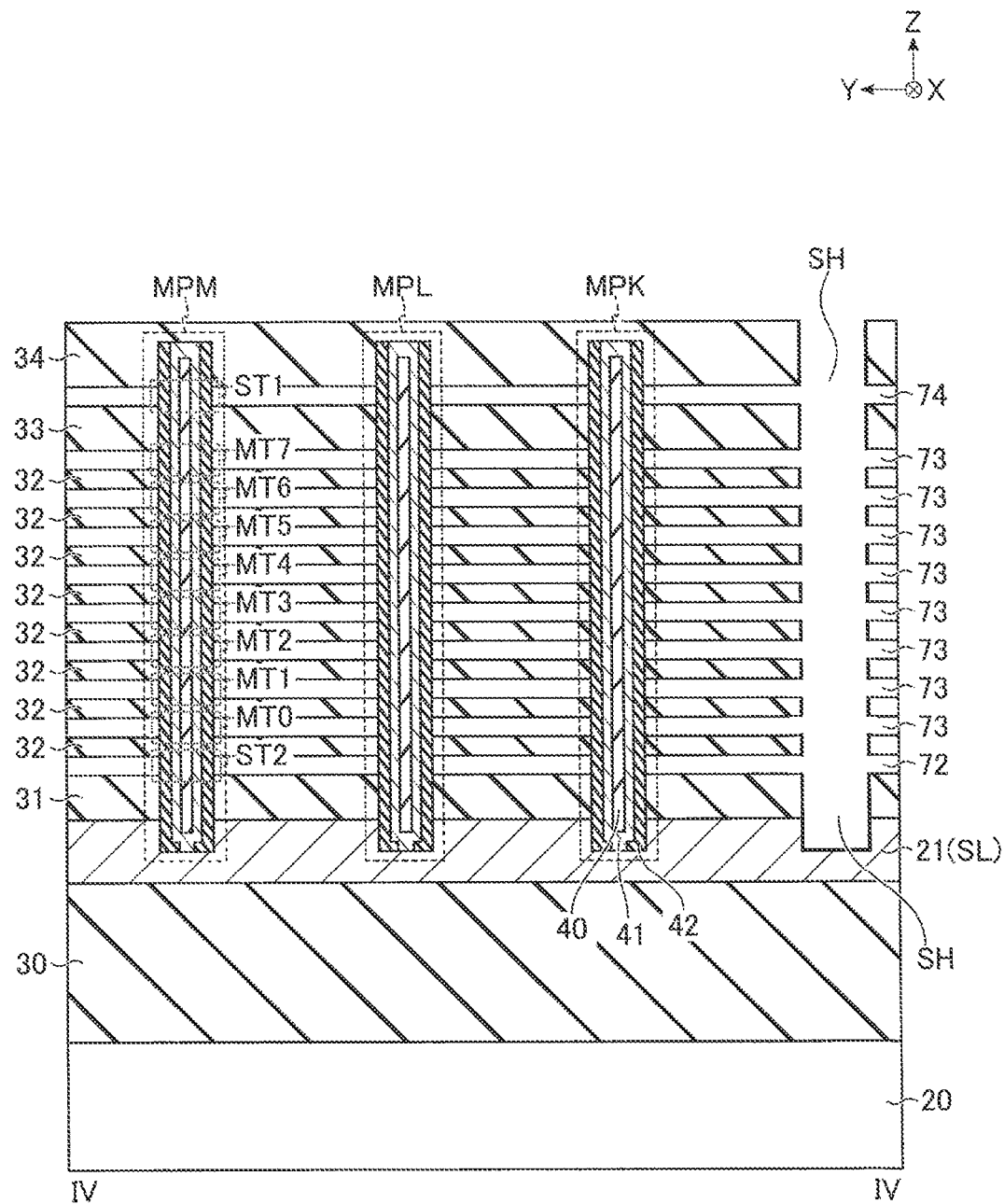

Next, a slit SH is formed and the sacrificial members 60 through 62 are removed as shown in FIG. 10 (step S103). First, a slit SH is formed in the area in which the member SLT is slated to be formed. Specifically, a mask including openings at the area to which the slit SH is slated to be formed is created by, for example, photolithography, and the slit SH is formed by anisotropic etching using the mask. Each slit SH divides each of, for example, the insulating layers 30 to 34 and the sacrificial members 60 to 62. After that, the sacrificial members 60 to 62 are selectively removed via the slit SH by, for example, wet etching using thermal phosphoric acid. Thus, spaces 72 to 74 are formed in areas in which the conductive layers 22 to 24 are slated to be formed. The structure from which the sacrificial members 60 to 62 have been removed is maintained by a plurality of memory pillars MP.

Figure 11:
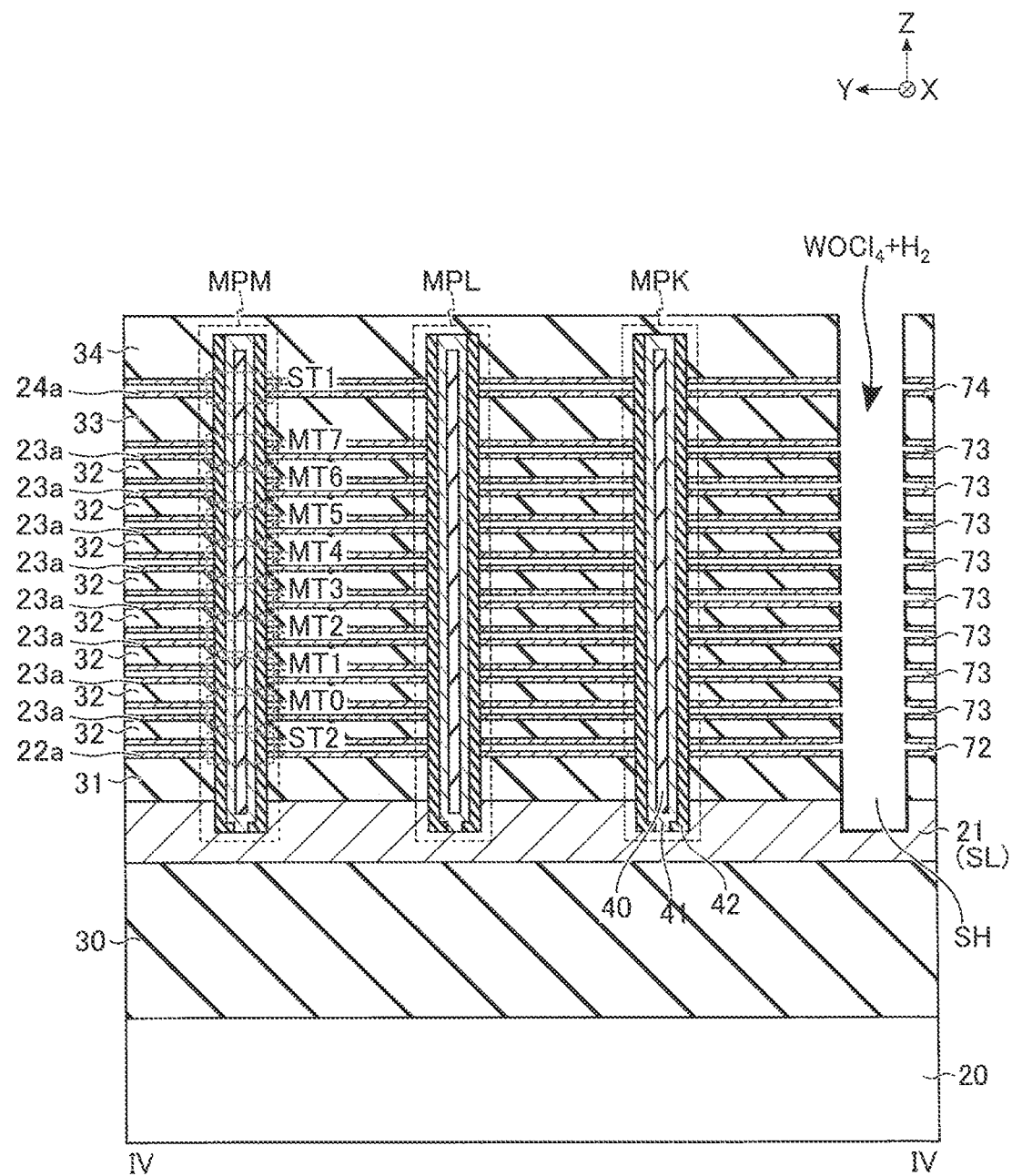
Figure 12:
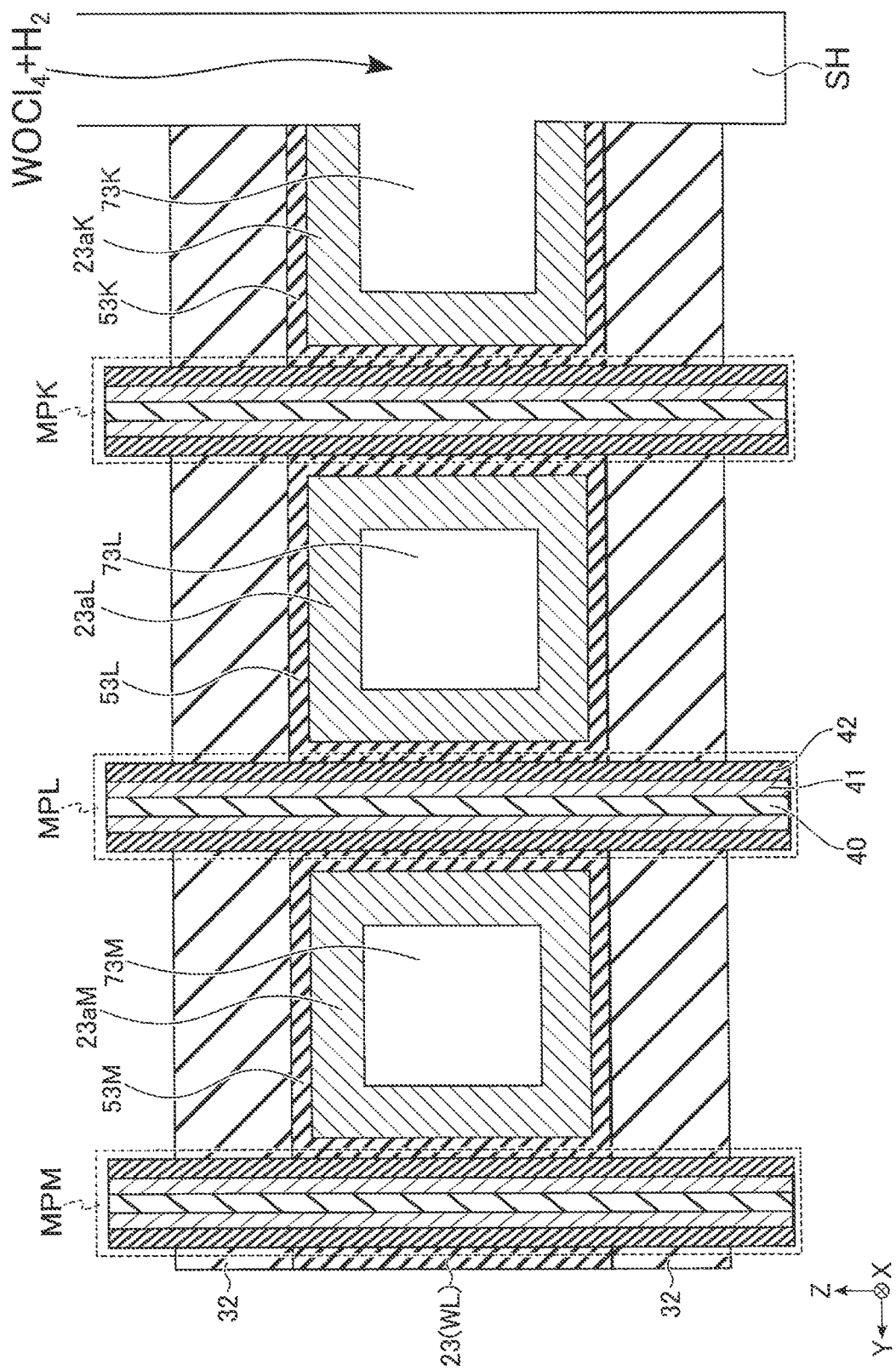

Next, the second block insulating films 52 to 54 and the conductive layers 22a to 24a are formed as shown in FIGS. 11 and 12 (step S104). FIG. 12 shows the second block insulating film 53 and the conductive layer 23a as an example, and the second block insulating films 52 and 54 and the conductive layers 22a and 24a are formed in a similar manner. Specifically, the second block insulating films 52 to 54 are formed on the surfaces where the spaces 72 to 74 formed in step S103 are exposed. Thereafter, the insulating layers 22a to 24a are formed on the second insulating film 52 to 54. Specifically, they are formed in a manner described below. For example, a gas containing tungsten, oxygen, and hydrogen reaches the spaces 72 to 74 via the slit SH. The gas used at this time does not contain fluorine. The tungsten and oxygen are reduced by hydrogen and accumulated on the second block insulating films 52 to 54 exposed in the spaces 72 to 74, respectively. As a result, the conductive layers 22a to 24a containing tungsten and oxygen are formed.

At this time, each of the thickness of the second block insulating films 52K to 54K, the thickness of the second block insulating films 52L to 54L, and the thickness of the second block insulating films 52M to 54M may be formed approximately uniformly. Each of the thickness of the conductive layers 22aK to 24aK, the thickness of the conductive layers 22aL to 24aL, and the thickness of the conductive layers 22aM to 24aM may be formed approximately uniformly.

Some portions in the spaces 72 to 74 are not embedded even after the conductive layers 22a to 24a are formed and remain as the spaces 72 to 74. The gas containing tungsten and oxygen is $WOCl_4$ and $WO_2Cl_2$, for example. The gas containing hydrogen is $H_2$, $B_2H_6$, or $SiH_4$, for example. The film deposition in this process is for example CVD.

Figure 13:
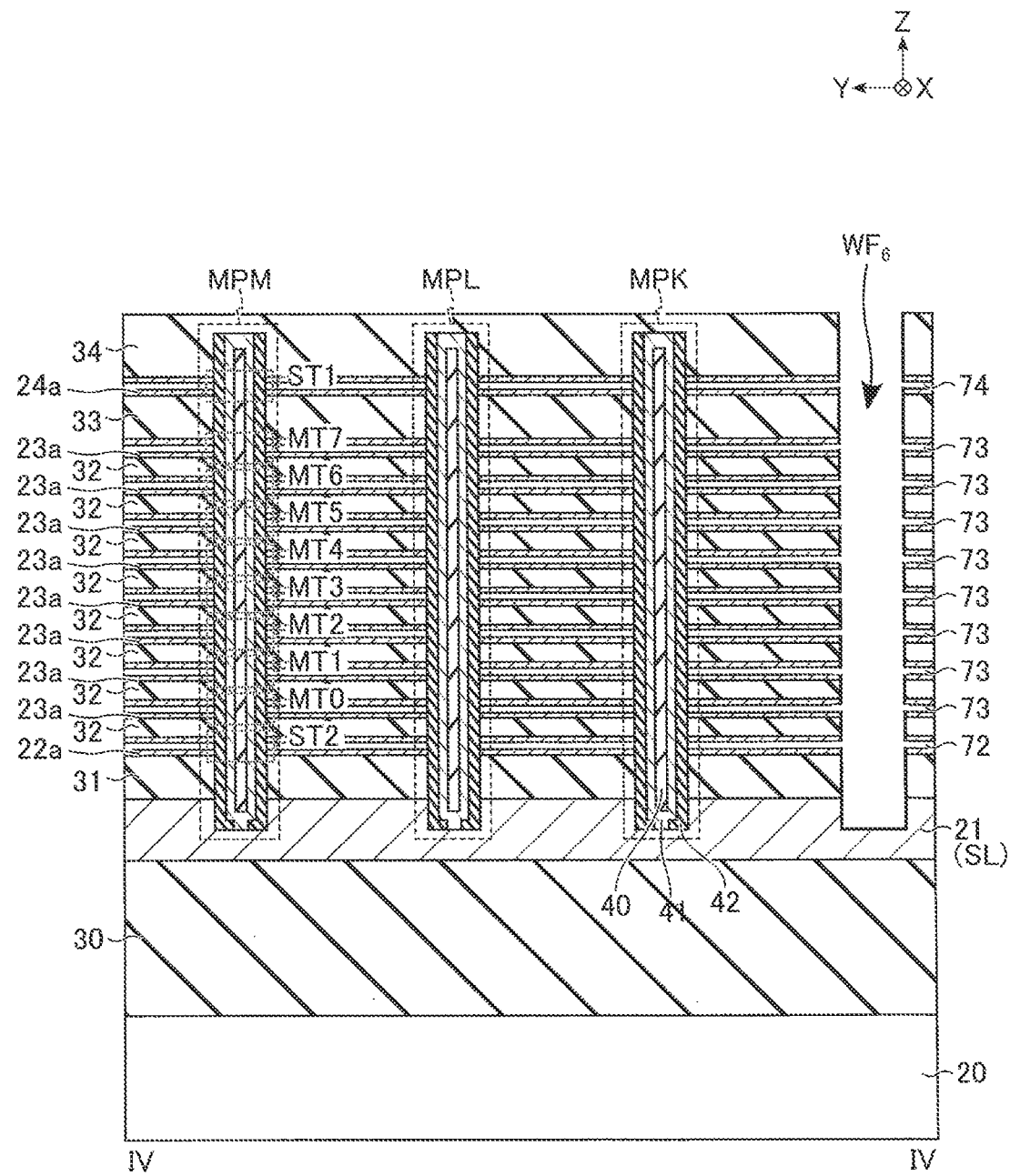
Figure 14:
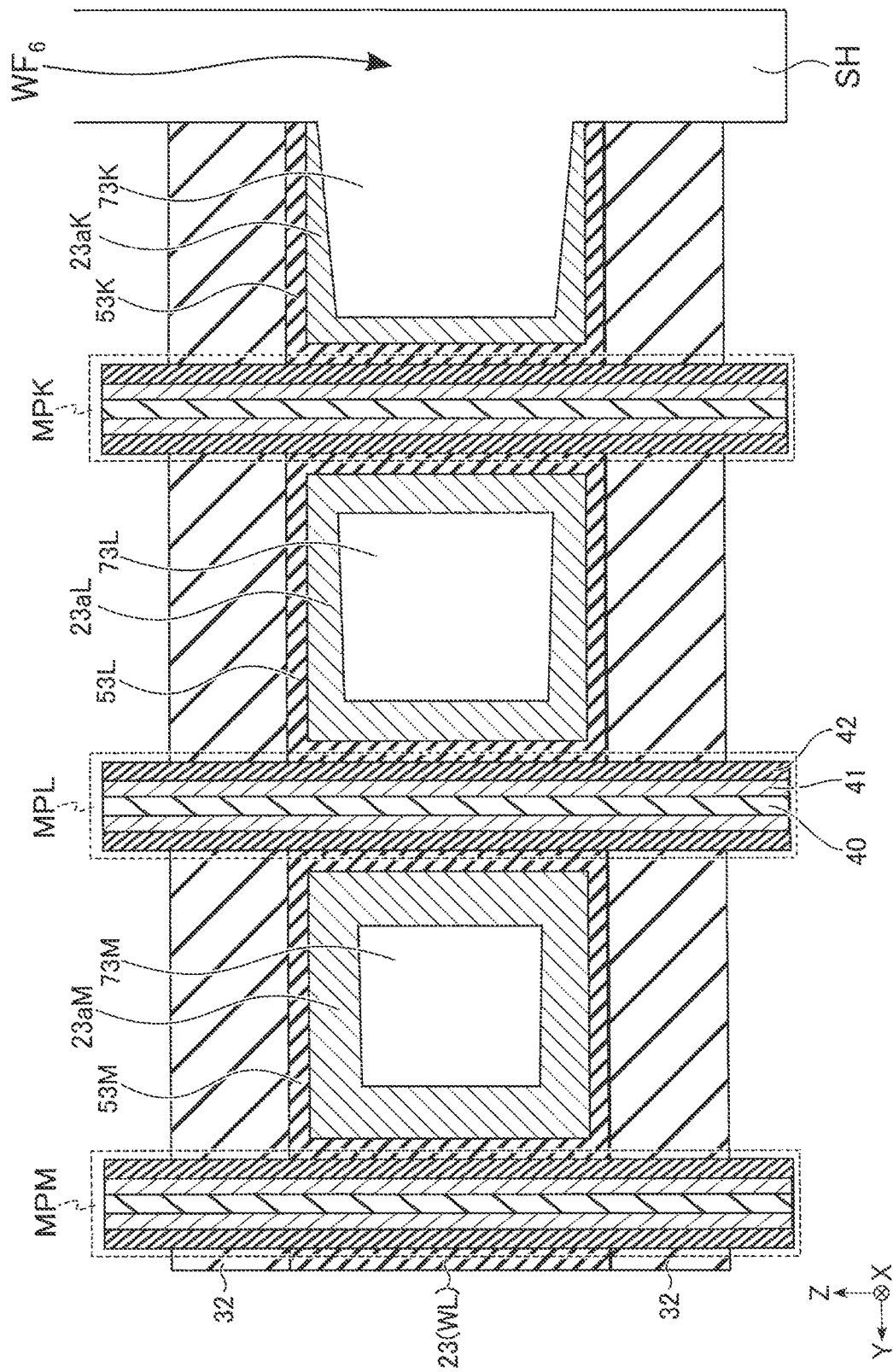

Next, parts of the conductive layers 22a to 24a are etched as shown in FIGS. 13 and 14 (step S105). Specifically, a gas containing tungsten and oxygen reaches the spaces 72 to 74 via the slit SH. The gas containing tungsten and fluorine is $WF_6$, for example. $WF_6$ that reaches the spaces 72 to 74 etches portions of the conductive layers 22a to 24a exposed inside the spaces 72 to 74. Since the conductive layer 23aK is located closer to the slit SH than is the conductive layer 23aL at this time, the conductive layer 23aK is more easily reached by $WF_6$ than the conductive layer 23aL. For this reason, an amount of etching is larger in the conductive layer 24aK than in the conductive layer 23aL; as a result, the conductive layer 23aK becomes thinner than the conductive layer 23aL. The same applies to the conductive layers 22aK and 24aK. In other words, an amount of etching is larger in the conductive layer 22aK than in the conductive layer 22aL and therefore the conductive layer 22aK becomes thinner than the conductive layer 22aL. An amount of etching is larger in the conductive layer 24aK than in the conductive layer 24aL and therefore the conductive layer 24aK becomes thinner than the conductive layer 24aL.

Similarly, since the conductive layer 23aF, is located closer to the slit SH than is the conductive layer 23aM at this time, the conductive layer 23aL is more easily reached by $WF_6$ than the conductive layer 23aM. For this reason, an amount of etching is larger in the conductive layer 24aL than in the conductive layer 23aM; as a result, the conductive layer 23aL becomes thinner than the conductive layer 23aM. The same applies to the conductive layers 22aL and 24aL. In other words, an amount of etching is larger in the conductive layer 22aL than in the conductive layer 22aM and therefore the conductive layer 22aL is thinner than the conductive layer 22aM. An amount of etching is larger in the conductive layer 24aL than in the conductive layer 24aM and therefore the conductive layer 24aL becomes thinner than the conductive layer 24aM.

Figure 15:
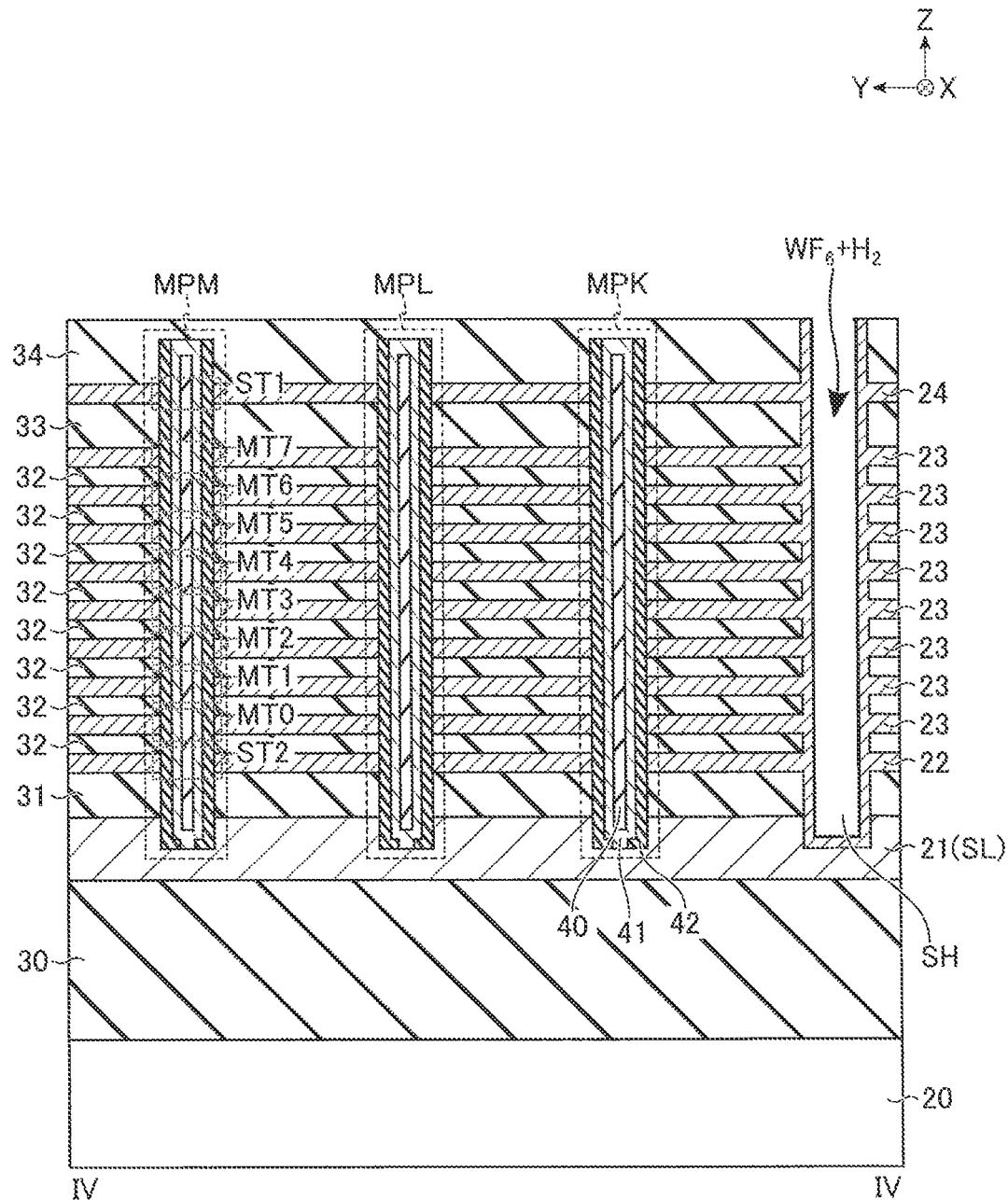
Figure 16:
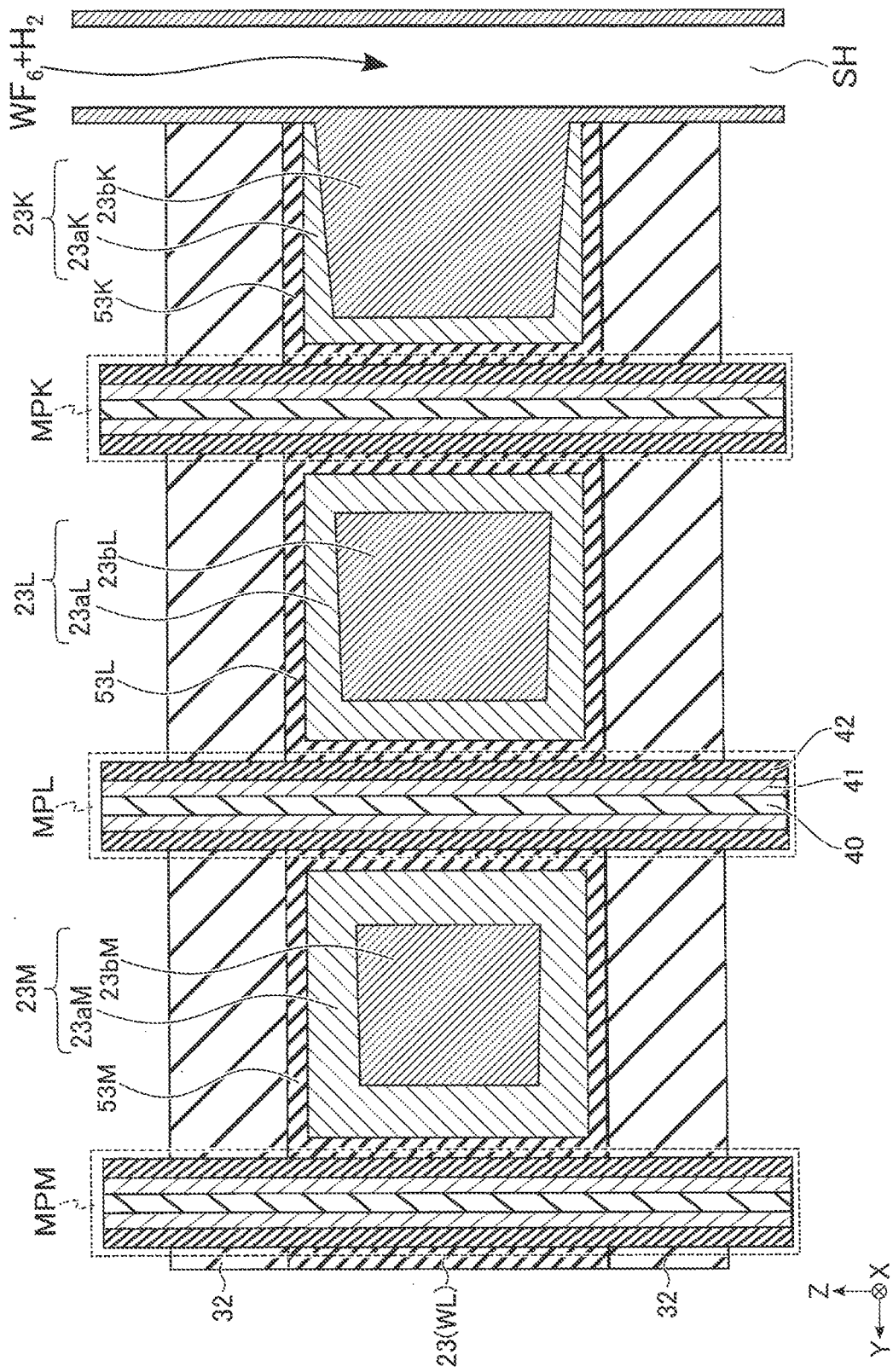

Next, the conductive layers 22b to 24b are formed as shown in FIGS. 15 and 16 (step S106). Specifically, a gas containing tungsten, fluorine, and hydrogen reaches the spaces 72b-74b via the slit SH. The gas containing tungsten and fluorine is $WF_6$, for example. The gas containing hydrogen is $H_2$, for example. Tungsten contained in the gas is accumulated on the surfaces of each of the conductive layers 22a to 24a etched in step S105, thereby forming the conductive layers 22b-24b. The spaces 72 to 74 are embedded with the conductive layers 22 to 24, respectively.

At this time, the conductive layer 23bK is thicker than the conductive layer 23bL. This is because the conductive layer 23aK, which is formed outside of the conductive layer 23bK, is thinner than the conductive layer 23aL, which is formed outside of the conductive layer 23bL. The space 73K becomes larger than the space 73L due to the etching performed in step S105, which renders the conductive layer 23aK thinner than the conductive layer 23aL. Since the space 73K becomes larger than the space 73L, the conductive layer 23bK embedded in the space 73K is formed thicker than the conductive layer 23bL embedded in the space 73L. The same applies to the conductive layers 22bK and 24bK. In other words, the conductive layer 22bK is formed thicker than the conductive layer 22bL. The conductive layer 24bK is formed thicker than the conductive layer 24bL.

Similarly, the conductive layer 23bL is thicker than the conductive layer 23bM. This is because the conductive layer 23aL, which is formed outside of the conductive layer 23bL, is thinner than the conductive layer 23aM, which is formed outside of the conductive layer 23bM. The space 73L becomes larger than the space 73M due to the etching performed in step S105, which renders the conductive layer 23aL thinner than the conductive layer 23aM. Since the space 73L becomes larger than the space 73M, the conductive layer 23bL embedded in the space 73L is formed thicker than the conductive layer 23bM embedded in the space 73M. The same applies to the conductive layers 22bL and 24bL. In other words, the conductive layer 22bL is formed thicker than the conductive layer 22bM. The conductive layer 24bL is formed thicker than the conductive layer 24bM.

The film deposition in this process is for example CVD.

Figure 17:
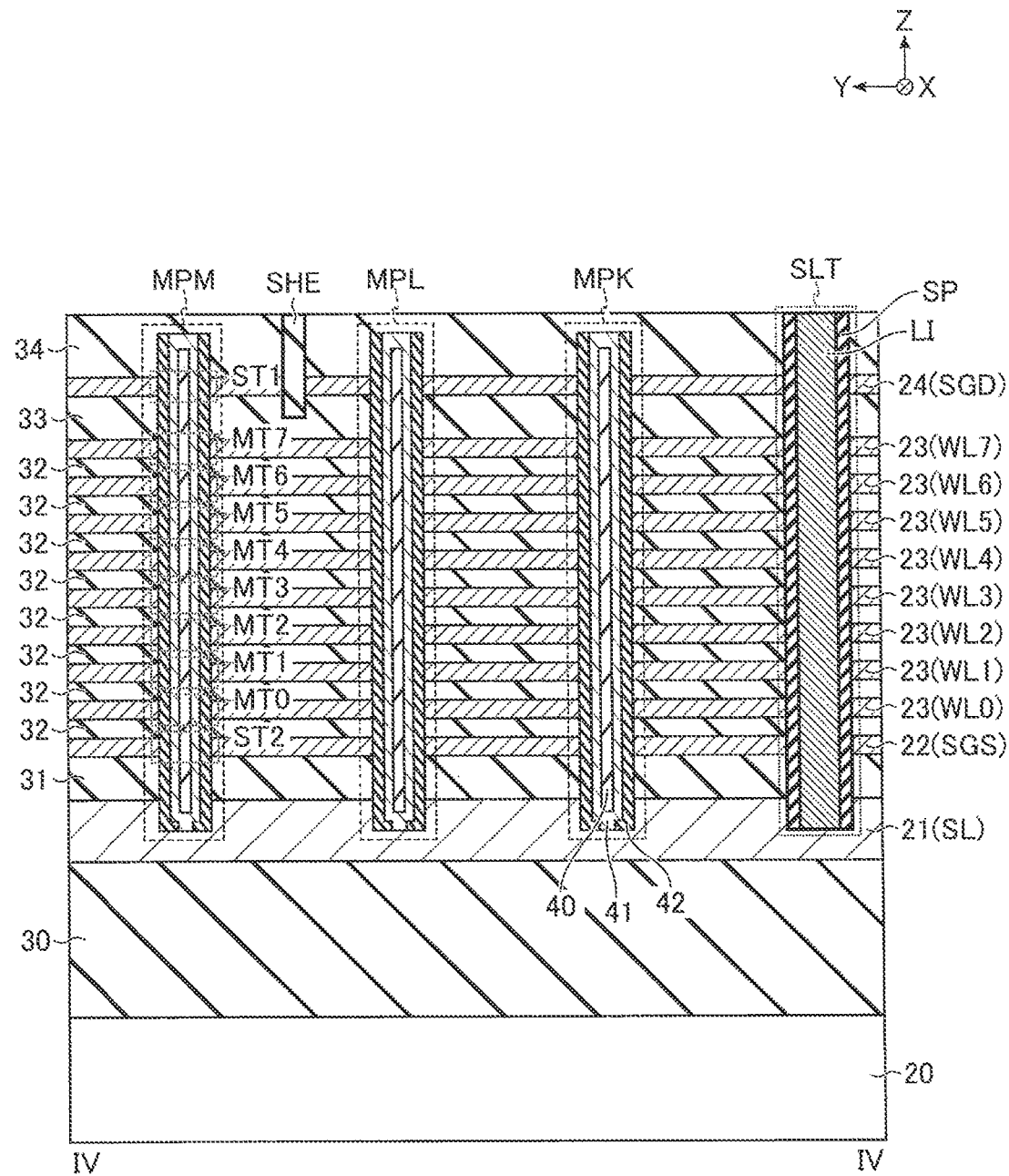

Next, the members SHE and members SLT are formed as shown in FIG. 17 (step S107). First, the conductors formed inside the slit SH are removed by an etchback process. The conductive layers 21 to 24 formed in this step do not include a barrier metal. The details will be described in the section stating advantageous effects.

Next, the member SLT is formed in each slit SH. Specifically, an insulating part (spacer SP) is formed so as to cover a side surface and a bottom surface of each slit SH. Thereafter, the spacer SP provided at a bottom part of the slit SH is partially removed, and the conductive layer 21 is partially exposed at the bottom part of the slit SH. Thereafter, a conductor (contact LI) is formed inside the slit SH. The conductors formed outside of the slit SH are removed by CMP, for example. Furthermore, the member SHE that partitions the conductive layer 24 of the stacked interconnect structure into multiple parts is formed.

Next, the insulating layer 34 on the memory pillar MP is removed and the contact CV is provided on the memory pillar MP. Next, the conductive layer 25 that functions as a bit line BL is formed on the contact CV.

By the manufacturing process of the semiconductor memory device 1 according to the first embodiment described above, the stacked interconnect structure in the memory cell array 10 is formed. The above-described manufacturing process is merely an example, and the manufacturing process is not limited thereto. For example, other processes may be inserted between the manufacturing steps, and some of the steps may be omitted or integrated. The manufacturing steps may be interchanged where possible.

[1-3] Advantageous Effects of First Embodiment

According to the semiconductor memory device 1 according to the foregoing first embodiment, it is possible to inhibit degradation of electrical characteristics of a memory cell transistor and to provide a high-quality semiconductor memory device. Hereinafter, advantages of the semiconductor memory device 1 according to the first embodiment will be described in detail. Hereinafter, the word lines WL and the select gate lines SGS and SGD in the semiconductor memory device may be referred to as "stacked interconnects LL".

For the stacked interconnects LL of the semiconductor memory device, tungsten is mainly used. The tungsten of the stacked interconnects LL is formed most commonly by CVD using a $WF_6$ gas. A $WF_6$ gas contains fluorine. For this reason, the tungsten layers of the stacked interconnects LL are fluorine-containing layers. Fluorine contained in the stacked interconnects LL may diffuse into adjacent layers, etc. in some cases, after undergoing a subsequent process (for example, heat processing). If fluorine diffuses into an interlayer insulating film which is in contact with the stacked interconnects LL or an insulating film of a memory pillar MP, $SiO_2$ contained in the interlayer insulating film and the insulating film of the memory pillar MP reacts with fluorine, and the insulation properties of these films may be deteriorated.

Figure 18:
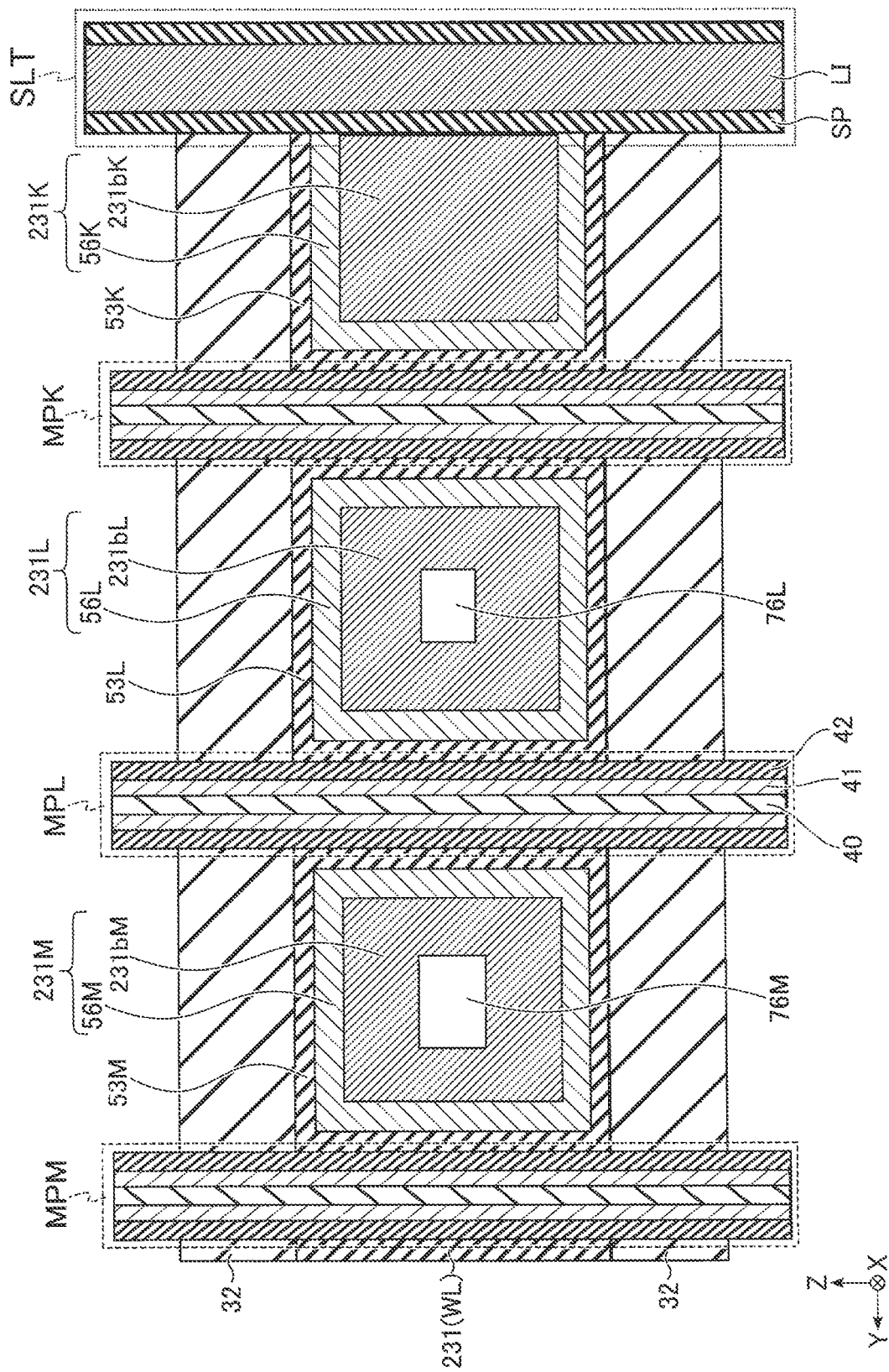
FIG. 18 shows an example of a cross-sectional structure of a memory cell array 10 included in a semiconductor memory device 111 according to a comparative example of the first embodiment.

For this reason, in the semiconductor memory device 111 according to a comparative example of the first embodiment, a film containing a barrier metal for preventing fluorine diffusion is formed between a tungsten layer containing fluorine and an interlayer insulating film, and between the tungsten layer containing fluorine and an insulating film of a memory pillar MP. FIG. 18 illustrates an example of a cross-sectional structure of a memory pillar MP in the semiconductor memory device 111 according to a comparative example of the first embodiment. FIG. 18 shows a cross section of the same area as that shown in FIG. 6. The semiconductor memory device 111 of the comparative example differs from the semiconductor memory device 1 of the first embodiment (FIG. 6) mainly in the structures of their stacked interconnects Lt.

As shown in FIG. 18, the semiconductor memory device 111 according to the comparative example has a conductive layer 231 inside the second block insulating film 53, for example. The conductive layer 231 functions as a word line WL and has a function similar to that of the conductive layer 23 in the first embodiment. The conductive layers 231 have a multilayered structure. The conductive layer 231 includes a conductive layer 56, a conductive layer 231b, and a void 76. FIG. 18 shows the conductive layer 231 in the second block insulating film 53 as an example, and the conductive layers in the second block insulating films 52 and 54 are similar to this example.

The conductive layer 56 is formed on the side surface of the second block insulating film 53. The conductive layer 56 functions as a barrier metal that prevents diffusion of fluorine into the insulating layer 32 and the stacked film 42. The conductive layer 56 includes titanium nitride (TiN) or titanium aluminum nitride (TiAlN), for example. In other words, the conductive layer 56 plays a role of preventing fluorine from reaching the insulating layer 32 and the stacked film 42. In other words, the conductive layer 56 functions as a film for preventing diffusion of fluorine (diffusion prevention film).

The conductive layer 231b is formed on the side surface of the conductive layer 56. Ideally, the conductive layer 231b is provided up to the center of the conductive layer 231. The conductive layer 231b has a function and a material similar to those of the conductive layer 23b and is a tungsten layer containing fluorine.

Differing from the semiconductor memory device 1 according to the first embodiment, the semiconductor memory device 111 according to the comparative example does not include the conductive layer 23a, which is a fluorine-free tungsten layer, in the word line WL.

Thus, through provision of the conductive layer 56 that functions as a barrier metal, the semiconductor memory device 111 according to the comparative example prevents diffusion of fluorine from the conductive layer 231.

However, the material used as a barrier metal has a high electric resistance compared to tungsten. By using a barrier metal having a high electric resistance as part of the word lines WL, the stacked interconnects LL of the semiconductor memory device Ill according to the comparative example may have, in turn, a high resistance, as a whole. Particularly, in the case of a NAND having a large number of stacked word lines WL, the width of each stacked interconnect LL becomes narrower. For this reason, for a NAND having a large number of stacked layers, it is demanded that no barrier metal be used in the word lines WL and a metal material having a low resistance be used.

In contrast, in the semiconductor memory device 1 according to the first embodiment, the stacked interconnects LL do not have a barrier metal (for example, the conductive layer 56). The semiconductor memory device 1 has the conductive layer 23a instead of having a barrier metal. As described above, the conductive layer 23a is tungsten not including fluorine. Since the conductive layer 23a includes no fluorine, fluorine does not diffuse into the insulating layer 32 and the stacked film 42 in the semiconductor memory device 1.

With the conductive layer 23a interposed between the conductive layer 23b, which is a fluorine-containing tungsten layer, and the insulating layer 32 and the stacked film 42, the conductive layer 23a functions as a fluorine-diffusion preventing film. Even if fluorine diffuses from the conductive layer 23b into the conductive layer 23a, fluorine remains in the conductive layer 23a and is capable of preventing fluorine from reaching the insulating layer 32 and the stacked film 42.

Since the conductive layer 23a is a tungsten layer, it has a lower electric resistance than that of the conductive layer 56 of the comparative example. In other words, the semiconductor memory device 1 according to the first embodiment has a low electric resistance in the stacked interconnects LL compared to the semiconductor memory device 111 of the comparative example.

Furthermore, compared to the semiconductor memory device 111 according to the comparative example, a void is less easily formed in the stacked interconnects LL in the semiconductor memory device 1 according to the first embodiment. Specifically, as shown in FIG. 18, the semiconductor memory device 111 of the comparative example has cavities 76M and 76L inside of the conductive layers 231bM and 231bL.

In the semiconductor memory device 111 according to the comparative example, the conductive layer 56 is formed with an approximately uniform thickness from the side closer to the member SLT to the side distant therefrom. The size of the space before formation of the conductive layer 231b is also approximately uniform from the side closer to the member SLT to the side distant therefrom. For this reason, when the conductive layer 231b is formed, the space in 231K may be blocked before the space in 231bL or 231bM is blocked.

Specifically, when the conductive layer 231b is formed, the $WF_6$ gas reaches from the side of the member SLT to the areas in which the conductive layers 231bK, 231bL, and 231bM are slated to be formed. The conductive layer 231b is formed by the gas that has reached the area. At this time, the conductive layer 231bK is located closer to the member SLT than are the conductive layers 231bL and 231bM; for this reason, the gas is more able to reach the conductive layer 231bK than to the conductive layer 231bL and 231bM. For this reason, the conductive layer 231bK is formed more easily than the conductive layers 231bL and 231bM. In other words, when a gas is caused to flow for a certain period of time, the conductive layer 231bK is formed thicker than are the conductive layers 231bL and 231bM. In other words, the conductive layer 231bK may fill the space before the conductive layers 231bL and 231bM do.

When the conductive layer 231bK fills the space, the space that allows the gas to flow is blocked; therefore, the gas will no longer flow in the areas in which the conductive layers 231bL and 231bM are slated to be formed. For this reason, the cavities 76M and 76L may remain inside of the conductive layers 231bM and 231bL.

At this time, a fluorine gas contained in $WF_6$ may accumulate in the cavities 76M and 76L. The fluorine gas may react with neighboring films when undergoing a high-temperature process, and the insulation properties of surrounding oxide films may be degraded. Degradation of insulation properties of oxide films may incurs a risk of current leakage between adjacent word lines WL, for example.

Furthermore, if there are remaining cavities 76M and 76L, the electric resistance of the conductive layer 231b may become higher.

In contrast, the semiconductor memory device 1 according to the first embodiment is designed in such a manner that a void does not remain the inside of the stacked interconnects LL. As described with reference to FIG. 14, the conductive layer 23a is partially etched in the semiconductor memory device 1 according to the first embodiment. Due to the etching, the conductive layer 23aK becomes thinner than the conductive layers 23aL and 23aM. With the conductive layer 23aK being formed thin, the area in which the conductive layer 23bK is slated to be formed is not easily blocked. In other words, to the extent that the conductor layer 23bK is deposited faster than the conductor layers 23bL and 23bM, the conductor layer 23aK is formed thin. By making it less easy for the area in which the conductive layer 23bK is slated to be formed to be blocked, it is possible to sufficiently fill the inside of the conductive layers 23L and 23M so that it is less easy for the void to remain.

As a result, compared to the semiconductor memory device 1 according to the comparative example, a void is less easily formed in the stacked interconnects LL in the semiconductor memory device 1 according to the first embodiment. By making it less easy for the void to remain, the semiconductor memory device 1 can reduce the risk of causing current leakage compared to the semiconductor memory device 111. Furthermore, by making it less easy for the void to remain, the semiconductor memory device 1 can reduce electric resistance of the word lines WL compared to the semiconductor memory device 111.

[2] SECOND EMBODIMENT

Hereinafter, a semiconductor memory device 1 according to the second embodiment will be described. The semiconductor memory device 1 according to the second embodiment differs from the semiconductor memory device 1 of the first embodiment. Hereinafter, the semiconductor memory device 1 of the second embodiment may be referred to as a "semiconductor memory device 1b" in order to distinguish it from the semiconductor memory device 1 of the first embodiment.

[2-1] Cross-Sectional Structure of Memory Cell Array 10

The semiconductor memory device 1b of the second embodiment differs from the semiconductor memory device 1 of the first embodiment mainly in the structures of their stacked interconnects LL. The stacked interconnects LL in the semiconductor memory device 1b further include conductive layers interposed between the conductive layers 22a to 24a and the second block insulating films 52 to 54. The other structures in the second embodiment are almost the same as those in the first embodiment. In the following, differences in the semiconductor memory device 1b according to the second embodiment from the first embodiment will be described.

Figure 19:
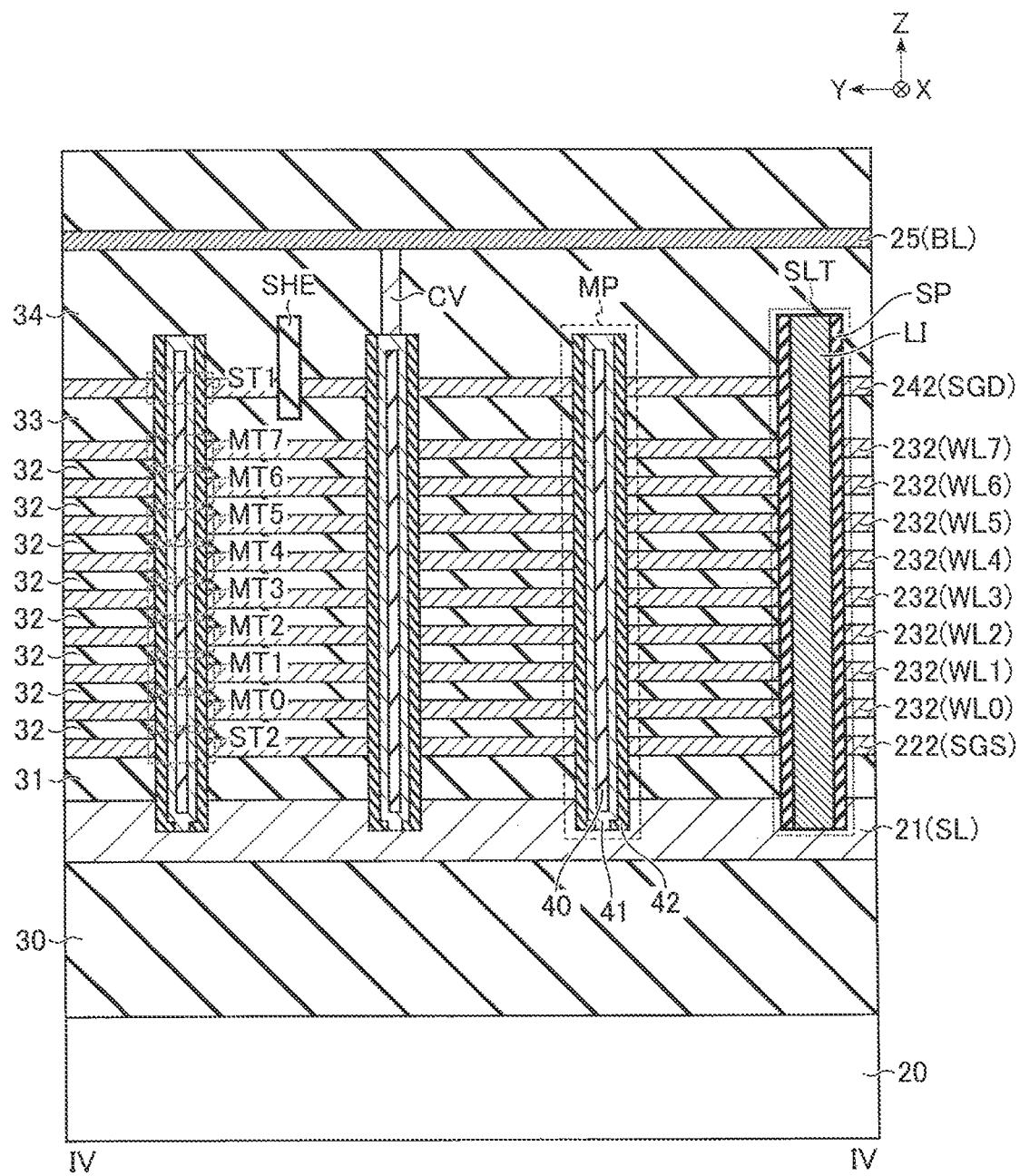
FIG. 19 shows an example of a cross-sectional structure of a memory cell array 10 included in a semiconductor memory device 1b according to a second embodiment.
Figure 20:
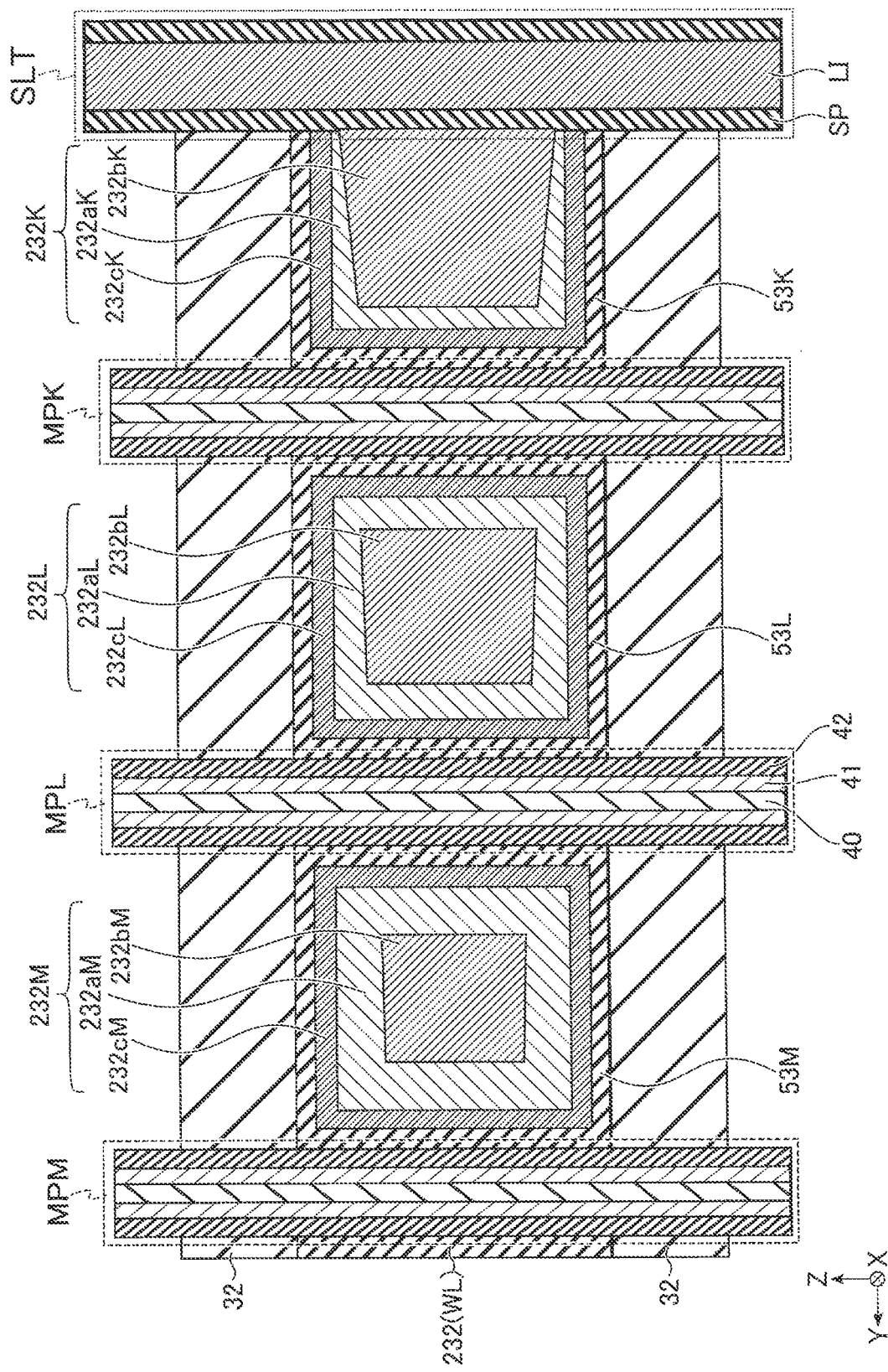
FIG. 20 is a partially enlarged view of the portion including a conductive layer 232 shown in FIG. 19.

Details of the structure of the word lines WL are described with reference co FIGS. 19 and 20. FIG. 19 shows an example of a cross-sectional structure of a memory cell array 10 included in a semiconductor memory device 1b according to a second embodiment. FIG. 19 shows a cross section of the same area as that shown in FIG. 4 of the first embodiment. FIG. 20 is a partially enlarged view of the portion including a conductive layer 232 (described later) shown in FIG. 19.

As shown in FIG. 19, the semiconductor memory device 1b of the second embodiment differs from the semiconductor memory device 1 of the first embodiment with respect to the structure of the parts called "the conductive layers 22 to 24" in the first embodiment. Hereinafter, the parts corresponding to the conductive layers 22 to 24 of the first embodiment may be called "conductive layers 222 to 242" in the second embodiment. Hereinafter, the conductive layers 222 to 242 in the second embodiment are described.

The insulating layer 31 is provided on the conductive layer 21. The conductive layer 222 is provided on the insulating layer 31. The conductive layer 222 has a plate-like shape expanding along the XY plane for example. The conductive layer 222 is used as the select gate line SGS. The conductive layer 222 contains tungsten (W) for example. Details of the conductive layer 222 will be described later with reference to FIG. 20.

The insulating layers 32 and the conductive layers 232 are alternately stacked above the conductive layer 222. The conductive layer 232 has a plate-like shape expanding along the XY plane for example. The stacked conductive layers 232 are used as word lines WL0 to WL7 in the order from the side of the semiconductor substrate 20. The conductive layer 232 contains, for example, tungsten. Details of the conductive layer 232 are described later with reference to FIG. 20.

The insulating layer 33 is provided on the uppermost conductive layer 232. The conductive layer 242 is provided on the insulating layer 33. The conductive layer 242 is formed in a plate-like shape along the XY plane for example and is used as a select gate line SGD. The conductive layer 242 contains, for example, tungsten. Details of the conductive layer 242 are described later with reference to FIG. 20.

FIG. 20 is a partially enlarged view of the portion including a conductive layer 232 shown in FIG. 19. The structure of the conductive layer 232 will be further explained with reference to FIG. 20.

Similarly to the first embodiment, the three illustrated memory pillars MP may be respectively referred to as a "memory pillar MPK", a "memory pillar MPL", and a "memory pillar MPM", in order of closeness to the member SLT. In the conductive layer 232, a portion interposed between the member SLT and the memory pillar MPK may be referred to as a "conductive layer 232K" hereinafter. In the conductive layer 232, a portion interposed between the memory pillar MPK and the memory pillar MPL may be referred to as a "conductive layer 232L" hereinafter. In the conductive layer 232, a portion interposed between the memory pillar MPL and the memory pillar MPM may be referred to as a "conductive layer 232M" hereinafter. Similarly, the structural elements in the area interposed between the member SLT and the memory pillar MPK may have a "K" added at the end of their reference symbols. The structural elements in the area interposed between the member MPK and the memory pillar MPL may have an "L" added at the end of their reference numbers. The structural elements in the area interposed between the member MPL and the memory pillar MPM may have an "M" added at the end of their reference numbers.

The conductive layers 232 are formed between the insulating layers 32. Although illustration is omitted in FIG. 19, a second block insulating film 53 is formed between the insulating layer 32 and the conductive layer 232, similarly to the first embodiment. The conductive layers 232 have a multilayered structure. The conductive layer 232 includes conductive layers 232a (232aK, 232aL, and 232aM), 232b (232bK, 232bL, and 232bM), and 232c (232cK, 232cL, and 232cM). In other words, the conductive layer 232K includes the conductive layer 232aK, the conductive layer 232bK, and the conductive layer 232cK. The conductive layer 232L includes the conductive layer 232aL, the conductive layer 232bL, and the conductive layer 232cL. The conductive layer 232M includes the conductive layer 232aM, the conductive layer 232bM, and the conductive layer 232cM.

The conductive layer 232b is formed in a plate-like shape expanding along the XY plane for example, and is provided inside of the conductive layer 232. The conductive layer 232a surrounds the surface of the conductive layer 232b. The conductive layer 232c surrounds the surface of the conductive layer 232a. The second block insulating film 53 surrounds the surface of the conductive layer 232c. A portion of the top and bottom surfaces of the second block insulating film 53 is in contact with the insulating layer 32. In a portion of the side surface of the memory pillar MP, the second block insulating film 53 is in contact with the first block insulating film 45.

Detailed descriptions of the conductive layer 232b are omitted, as the material and function are similar to those of the conductive layer 23b. Detailed descriptions of the conductive layer 232a are omitted, as the material and function are similar to those of the conductive layer 23a.

The conductive structure 232c contains tungsten, oxygen, and nitrogen, for example. The materials of the conductive layer 232c and the conductive layer 232a both mainly contain tungsten and oxygen but they differ mainly in their nitrogen content. The content of nitrogen in the conductive layer 232c is greater than that in the conductive layer 232a. Ideally, the conductive layer 232a does not contain nitrogen at the time when formed; however, nitrogen contained in the conductive layer 232*c* may partially diffuse into the conductive layer 232*a* after the conductive layer 232*c* undergoes subsequent manufacturing steps. Even in this case, an amount of nitride contained in the conductive layer 232*c* is greater than that in the conductive layer 232*a*. At this time, the nitride concentration in the conductive layer 232*a* is high in the area close to the conductive layer 232*c* and low in the area far therefrom.

The conductive layer 232*c* is tungsten nitride, for example. The particle size of tungsten nitride is smaller than that of tungsten.

The conductive layer 232*c* has a role of preventing diffusion of fluorine contained in the conductive layer 232*b* into the insulating layer 32 and the first block insulating film 45 beyond the conductive layer 232*a* and 232*c* and the second block insulating film 53.

Thus, the conductive layer 232 differs from the conductive layer 23 as the former has an additional conductive layer 232*c* between the conductive layer 232*a* and the second block insulating film 53.

The conductive layer 232*a* located closer to the member SLT is formed thinner than the one located far from the member SLT, similarly to the conductive layer 23*a*. Specifically, an average of the thickness of the conductive layer 232*a*K is smaller than that of the conductive layer 232*a*L. An average of the thickness of the conductive layer 232*a*L is smaller than that of the conductive layer 232*a*M. The thickness of the conductive layer 232*a* is a length between the conductive layer 232*c* and the conductive layer 232*b* in the YZ plane.

The conductive layer 232*b* located closer to the member SLT is formed thicker than the one located far from the member SLT, similarly to the conductive layers 23*b*. Specifically, an average of the thickness of the conductive layer 232*b*K is larger than that of the conductive layer 232*b*L. An average of the thickness of the conductive layer 232*b*L is larger than that of the conductive layer 232*b*M. The thickness of the conductive layer 232*b* is a thickness in the Y direction or Z direction of the conductive layer 232*b*.

The conductive layers 232*c*K, 232*c*L, and 232*c*M are formed with or without an approximately uniform thickness. It suffices that the conductive layer 232*c*K has a thickness that prevents diffusion of fluorine contained in the conductive layer 232*b*K into the insulating layer 32 and the first block insulating film 45 beyond the conductive layer 232*a*K and 232*c*K and the second block insulating film 53.

The conductive layers 222 and 242 also have a structure similar to that of the conductive layer 232 illustrated in FIG. 6.

The conductive layer 242 (242K, 242L, and 242M) is formed between the insulating layer 33 and the insulating layer 34. Although illustration is omitted in FIG. 19, the second block insulating film 54 is formed between the insulating layer 33 or the insulating layer 34 and the conductive layer 242, similarly to the first embodiment. The conductive layer 242 has a multilayered structure. The conductive layer 242 includes conductive layers 242*a* (242*a*K, 242*a*L, and 242*a*M), 242*b* (242*b*K, 242*b*L, and 242*b*M), and 242*c* (242*c*K, 242*c*L, and 242*c*M).

The second block insulating film 54 (54K, 54L, 54M) and the conductive layers 242*a*, 242*b*, and 242*c* are similar to the second block insulating film 53 and the conductive layers 232*a*, 232*b*, and 232*c*, respectively. For this reason, the matters regarding the second block insulating film 53 and the conductive layer 232*a*, 232*b*, and 232*c* are applicable to the second block insulating film 54 and the conductive layer 242*a*, 242*b*, and 242*c*, and detailed explanation is omitted, except for the matters explained hereinafter.

The conductive layer 242*a* located closer to the member SLT is formed thinner than the one located far from the member SLT, similarly to the conductive layer 24*a*. Specifically, an average of the thickness of the conductive layer 242*a*K is smaller than that of the conductive layer 242*a*L. An average of the thickness of the conductive layer 242*a*L is smaller than that of the conductive layer 242*a*M. The thickness of the conductive layer 242*a* is a length between the conductive layer 242*c* and the conductive layer 242*b* in the YZ plane.

The conductive layer 242*b* located closer to the member SLT is formed thicker than the one located far from the member SLT, similarly to the conductive layer 24*b*. Specifically, an average of the thickness of the conductive layer 242*b*K is larger than that of the conductive layer 242*b*L. An average of the thickness of the conductive layer 242*b*L is larger than that of the conductive layer 242*b*M. The thickness of the conductive layer 242*b* is a thickness in the Y direction or Z direction of the conductive layer 242*b*.

The conductive layers 242*c*K, 242*c*L, and 242*c*M are formed with or without an approximately uniform thickness. It suffices that the conductive layer 242*c*K has a thickness that prevents diffusion of fluorine contained in the conductive layer 242*b*K into the insulating layer 33, the insulating layer 34, and/or the first block insulating film 45 beyond the conductive layer 242*a*K and 242*c*K and the second block insulating film 54.

Similarly, the conductive layer 222 (222K, 222L, and 222M) is formed between the insulating layer 31 and the insulating layer 32. Although illustration is omitted in FIG. 19, the second block insulating film 52 is formed between the insulating layer 31 or the insulating layer 32 and the conductive layer 222, similarly to the first embodiment. The conductive layer 222 has a multilayered structure. The conductive layer 222 includes conductive layers 222*a* (222*a*K, 222*a*L, and 222*a*M), 222*b* (222*b*K, 222*b*L, and 222*b*M), and 222*c* (222*c*K, 222*c*L, and 222*c*M).

The second block insulating film 52 (52K, 52L, 52M) and the conductive layers 222*a*, 222*b*, and 222*c* are similar to the second block insulating film 53 and the conductive layers 232*a*, 232*b*, and 232*c*, respectively. For this reason, the matters regarding the second block insulating film 53 and the conductive layers 232*a*, 232*b*, and 232*c* are applicable to the second block insulating film 52 and the conductive layers 222*a*, 222*b*, and 222*c*, and detailed explanation is omitted, except for the matters explained hereinafter.

The conductive layer 222*a* located closer to the member SLT is formed thinner than the one located far from the member SLT, similarly to the conductive layer 22*a*. Specifically, an average of the thickness of the conductive layer 222*a*K is smaller than that of the conductive layer 222*a*L. An average of the thickness of the conductive layer 222*a*L is smaller than that of the conductive layer 222*a*M. The thickness of the conductive layer 222*a* is a length between the conductive layer 222*c* and the conductive layer 222*b* in the YZ plane.

The conductive layer 222*b* located closer to the member SLT is formed thicker than the one located far from the member SLT, similarly to the conductive layer 22*b*. Specifically, an average of the thickness of the conductive layer 222*b*K is larger than that of the conductive layer 222*b*L. An average of the thickness of the conductive layer 222*b*L is larger than that of the conductive layer 222*b*M. The thickness of the conductive layer 222*b* is a thickness in the Y direction or Z direction of the conductive layer 222*b*.

The conductive layers 222cK, 222cL, and 222cM are formed with or without an approximately uniform thickness. It suffices that the conductive layer 222cK has a thickness that prevents diffusion of fluorine contained in the conductive layer 222bK into the insulating layer 33, the insulating layer 34, and/or the first block insulating film 45 beyond the conductive layer 222aK and 222cK and the second block insulating film 52.

[2-2] Manufacturing Method of Semiconductor Memory Device 1b

Figure 21:
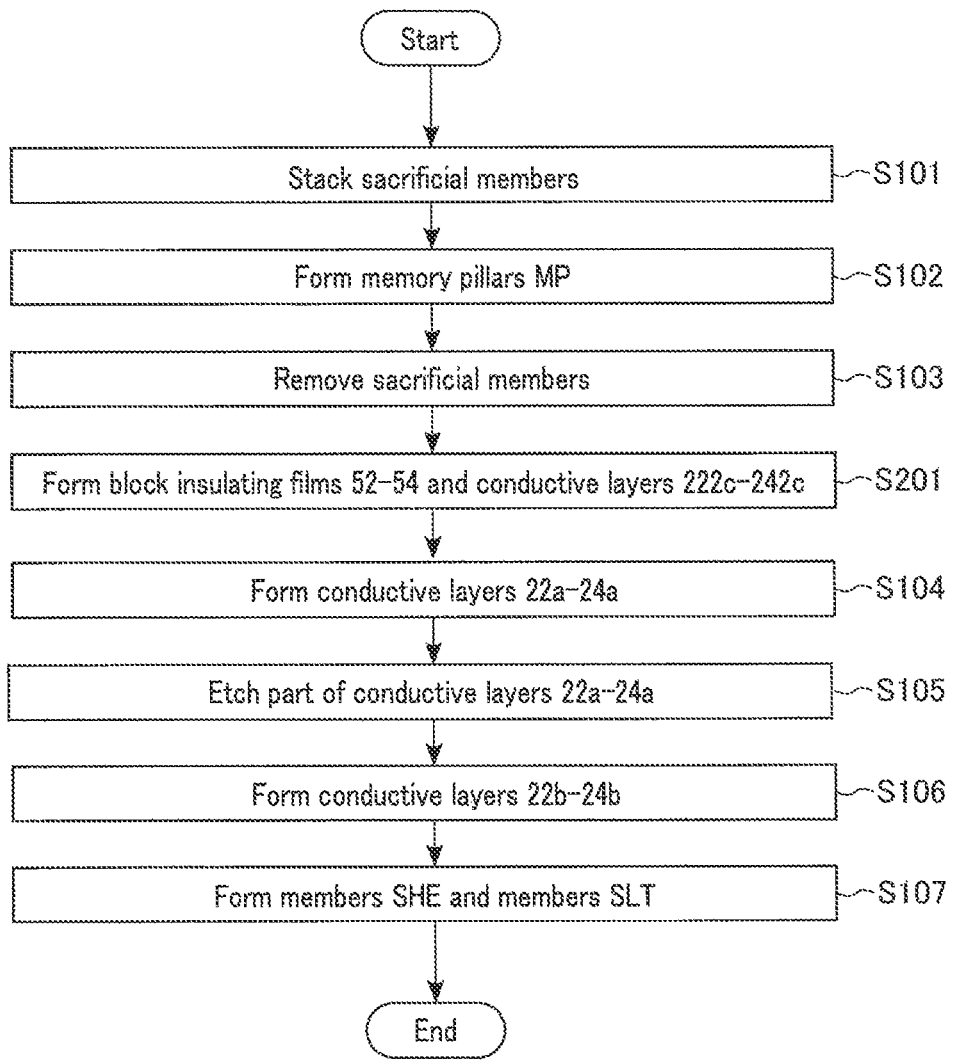
FIG. 21 is a flowchart showing an example of a method of manufacturing the semiconductor memory device 1b according to the second embodiment.
Figure 22:
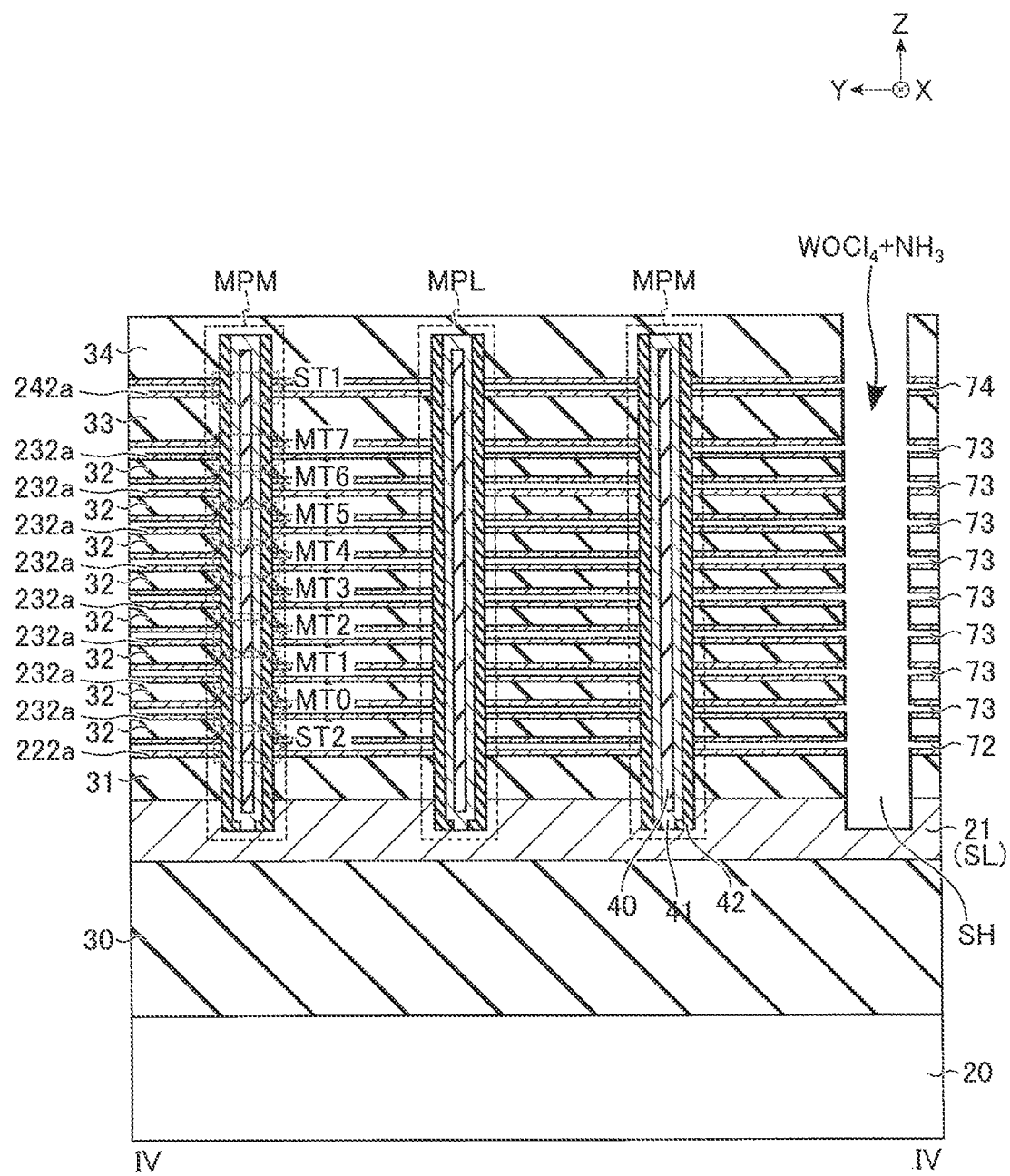
FIGS. 22 to 23 show examples of cross-sectional structures of the semiconductor memory device 1b in the course of manufacturing according to the second embodiment.
Figure 23:
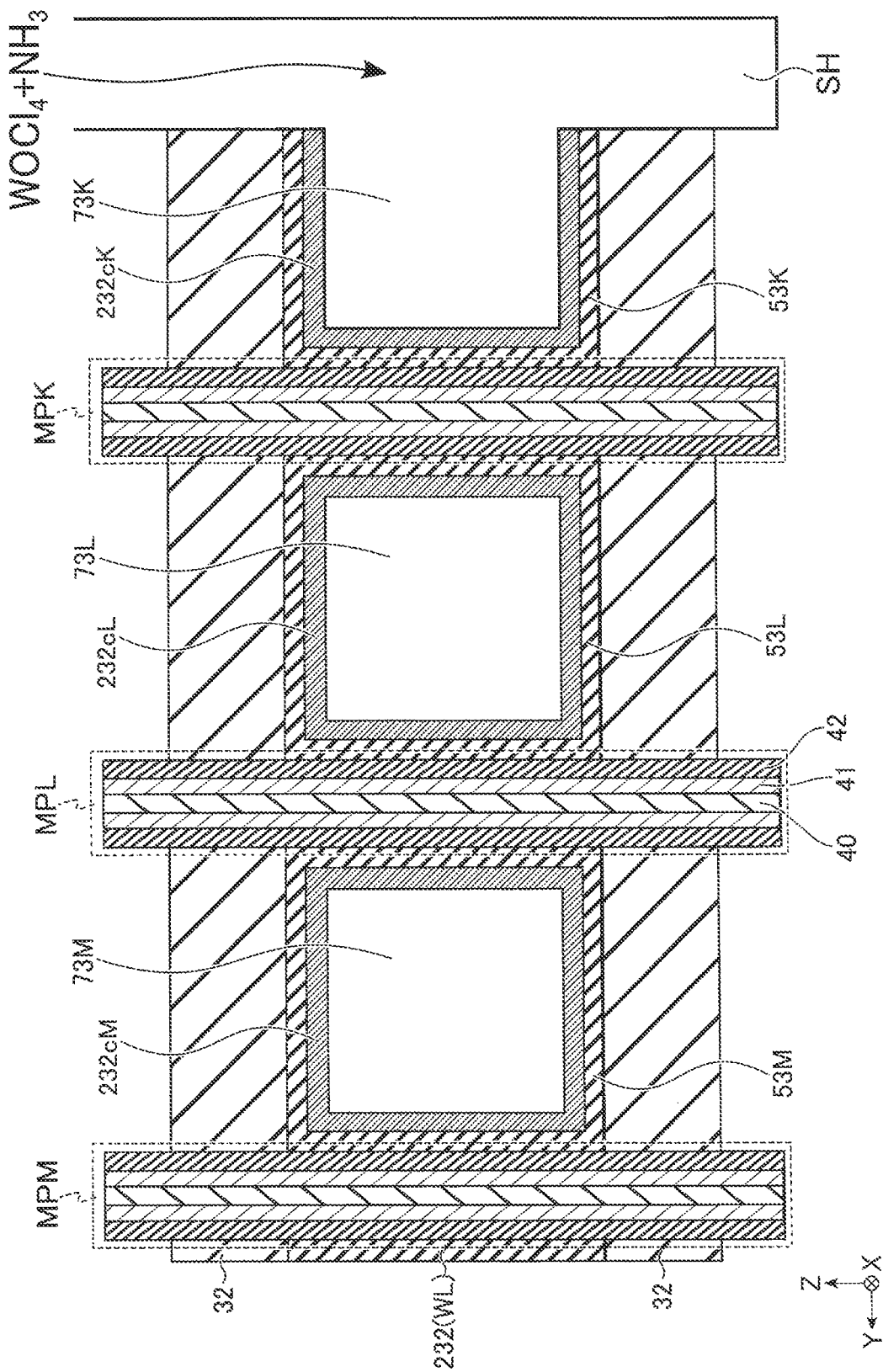

Hereinafter, an example of a series of manufacturing steps related to the formation of a stacked interconnect structure in the memory cell array 10 in the semiconductor memory device 1b according to the second embodiment will be described, with reference to FIG. 21. FIG. 21 is a flowchart showing an example of the method for manufacturing the semiconductor memory device 1b according to the second embodiment. Each of FIGS. 22 to 23 shows an example of a cross-sectional structure of the semiconductor memory device 1b in the course of manufacturing according to the second embodiment. FIGS. 22 and 23 show the cross sections of the same areas as those shown in FIGS. 4 and 6, respectively.

First, similarly to the first embodiment, the processes in step S101 through step S103 are performed in order.

Next, the second block insulating films 52 to 54 and the conductive layers 222c to 242c are formed as shown in FIGS. 22 and 23 (step S201). FIG. 22 shows the second block insulating film 53 and the conductive layer 232c as an example, and the second block insulating films 52 and 54 and the conductive layers 222c and 242c are formed in a similar manner.

Specifically, the second block insulating films 52 to 54 are formed on the surfaces where the spaces 72 to 74 formed in step S103 are exposed. Thereafter, the insulating layers 222c to 242c are formed on the second insulating film 52 to 54, respectively. Specifically, they are formed in a manner described below. For example a gas containing tungsten, oxygen, and ammonium reaches the spaces 72 to 74 via the slit SH. The gas used at this time does not contain fluorine. The tungsten and oxygen are reduced by ammonium and accumulated on the second block insulating films 52 to 54 exposed in the spaces 72 to 74, respectively. As a result, the conductive layers 222c to 242c containing tungsten, oxygen, and nitrogen are formed.

At this time, each of the thickness of the second block insulating films 52K to 54K, the thickness of the second block insulating films 52L to 54L, and the thickness of the second block insulating films 52M to 54M may be formed approximately uniformly. Each of the thickness of the conductive layers 222cK to 242cK, the thickness of the conductive layers 222cL to 242cL, and the thickness of the conductive layers 222cM to 242cM may be formed approximately uniformly.

Some portions in the spaces 72 to 74 are not embedded even after the conductive layers 222c to 242c are formed and remain as the spaces 72 to 74. The gas containing tungsten and oxygen is $WOCl_4$ and $WO_2Cl_2$, for example. The film deposition in this process is for example CVD.

Then, similarly to the first embodiment, the processes in step S104 through step S107 are performed in order. The stacked interconnect structure in the memory cell array is thus formed in the second embodiment. The above-described manufacturing steps are merely an example, and another process may be inserted between the manufacturing steps.

[2-3] Advantageous Effects of Second Embodiment

According to the semiconductor memory device 1b according to the foregoing second embodiment, it is possible to suppress degradation of electrical characteristics of a memory cell transistor and to provide a high-quality semiconductor memory device, similarly to the first embodiment. Furthermore, it is possible to effectively reduce the diffusion of fluorine in the semiconductor memory device 1b according to the second embodiment than in the semiconductor memory device 1 of the first embodiment.

First, the semiconductor memory device 1b according to the second embodiment does not include a barrier metal in the stacked interconnects LL, similarly to the first embodiment. Instead of a barrier metal, the semiconductor memory device 1b includes a tungsten layer free of fluorine. Having such a structure, the semiconductor memory device 1b has a low electric resistance in the stacked interconnects LL, compared to the semiconductor memory device 111 according to the comparative example of the first embodiment. In addition, the semiconductor memory device 1b is capable of maintaining the electric resistance of the stacked interconnects LL low and preventing fluorine from diffusing into the inter-layer insulating film adjacent to the stacked interconnects LL and the insulating film of the memory pillar MP at the same time.

According to the semiconductor memory device 1b of the second embodiment, similarly to the first embodiment, a void is less easily formed in the stacked interconnects LL in the semiconductor memory device 1, compared to the semiconductor memory device 111 according to the comparative example of the first embodiment. By making it less easy for the void to remain, the semiconductor memory device 1b can reduce the risk of causing current leakage compared to the semiconductor memory device 111. Furthermore, by making it less easy for the void to remain, the semiconductor memory device 1b can reduce electric resistance of the word lines WL compared to the semiconductor memory device 111.

Furthermore, as described above, the conductive layer 222c to 242c of the semiconductor memory device 1b further includes nitrogen in addition to tungsten and oxygen. Since the conductive layers 222c to 242c contain nitrogen, tungsten contained in the conductive layers 222c to 242c is partially nitrided. The particle size of the crystals of tungsten nitride is smaller than that of the crystals of tungsten. Since diffusion progresses along a grain boundary, fluorine diffusion does not easily occur if the particle size of an element that constitutes a crystal is small. In other words, fluorine less easily diffuses into tungsten nitride than into tungsten.

For this reason, less fluorine diffuses into the conductive layers 222c to 242c than into the conductive layers 222a to 242a and the conductive layers 22a to 24a. In other words, of fluorine diffusion can be reduced more greatly in the semiconductor memory device 1b according to the second embodiment, which includes the conductive layers 222c to 242c containing tungsten nitride in the stacked interconnects LL, than in the semiconductor memory device 1 according to the first embodiment, which does not contain tungsten nitride in the stacked interconnects LL. In other words, according to the semiconductor memory device 1b of the second embodiment, it is possible to reduce fluorine diffusion more effectively than the case with the semiconductor memory device 1 according to the first embodiment.

[3] OTHER MODIFICATIONS, ETC

Figure 24:
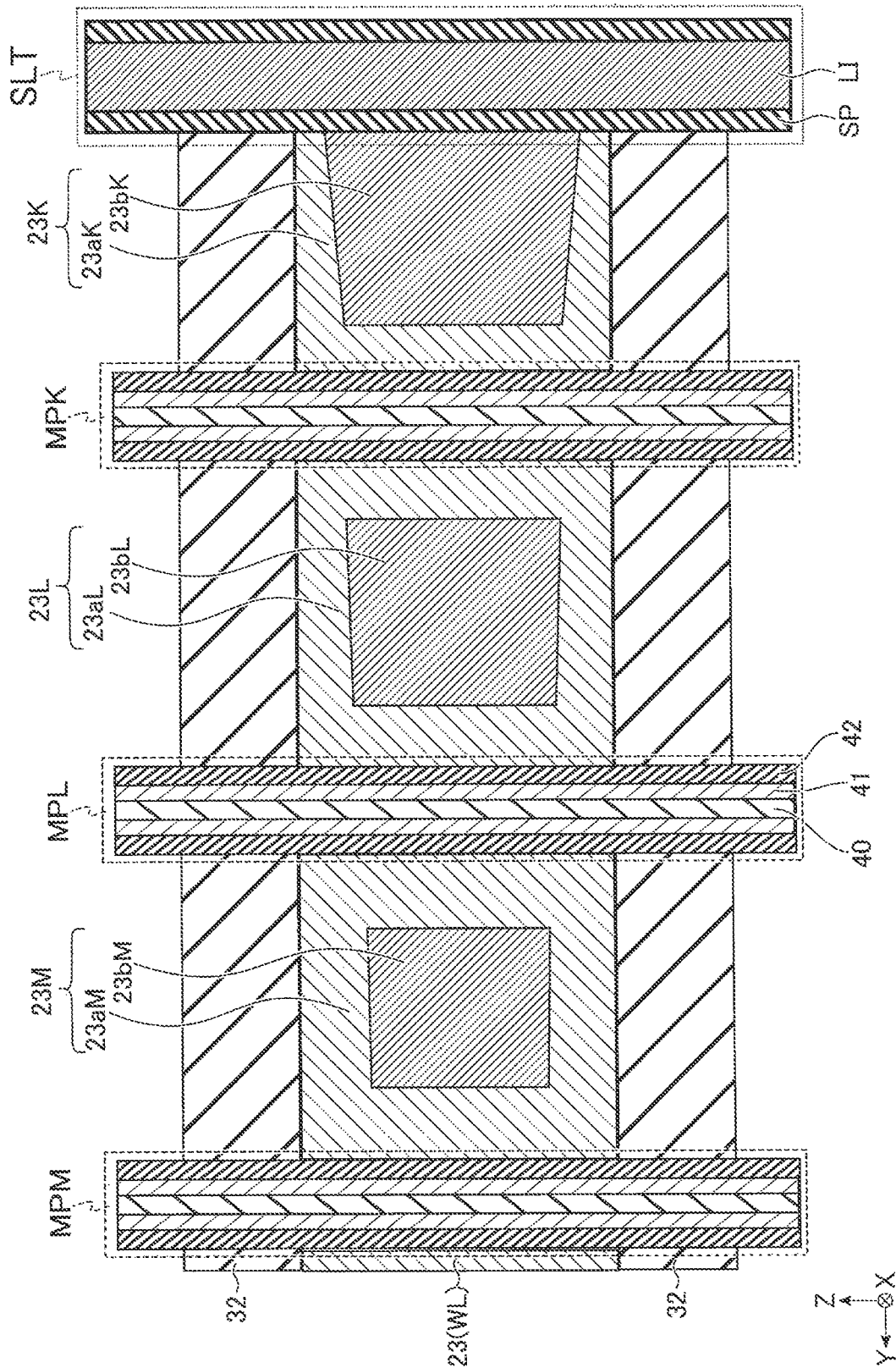
FIG. 24 shows an example of a cross-sectional structure of a memory cell array 10 included in a semiconductor memory device 1 according to a modification of the first embodiment.

In the first embodiments described above, the second block insulating film 53 is formed between the insulating layer 32 and the conductive layer 23. However, the second block insulating film 53 may be omitted. FIG. 24 shows an example of a cross-sectional structure of a memory cell array 10 included in a semiconductor memory device 1 according to a modification of the first embodiment.

FIG. 24 shows a cross section of the same area as that shown in FIG. 4. As shown in FIG. 24, the memory cell array 10 according to the modification of the first embodiment does not include the second block insulating film 53. For this reason, the conductive layer 23a is in contact with the insulating layer 32.

Figure 25:
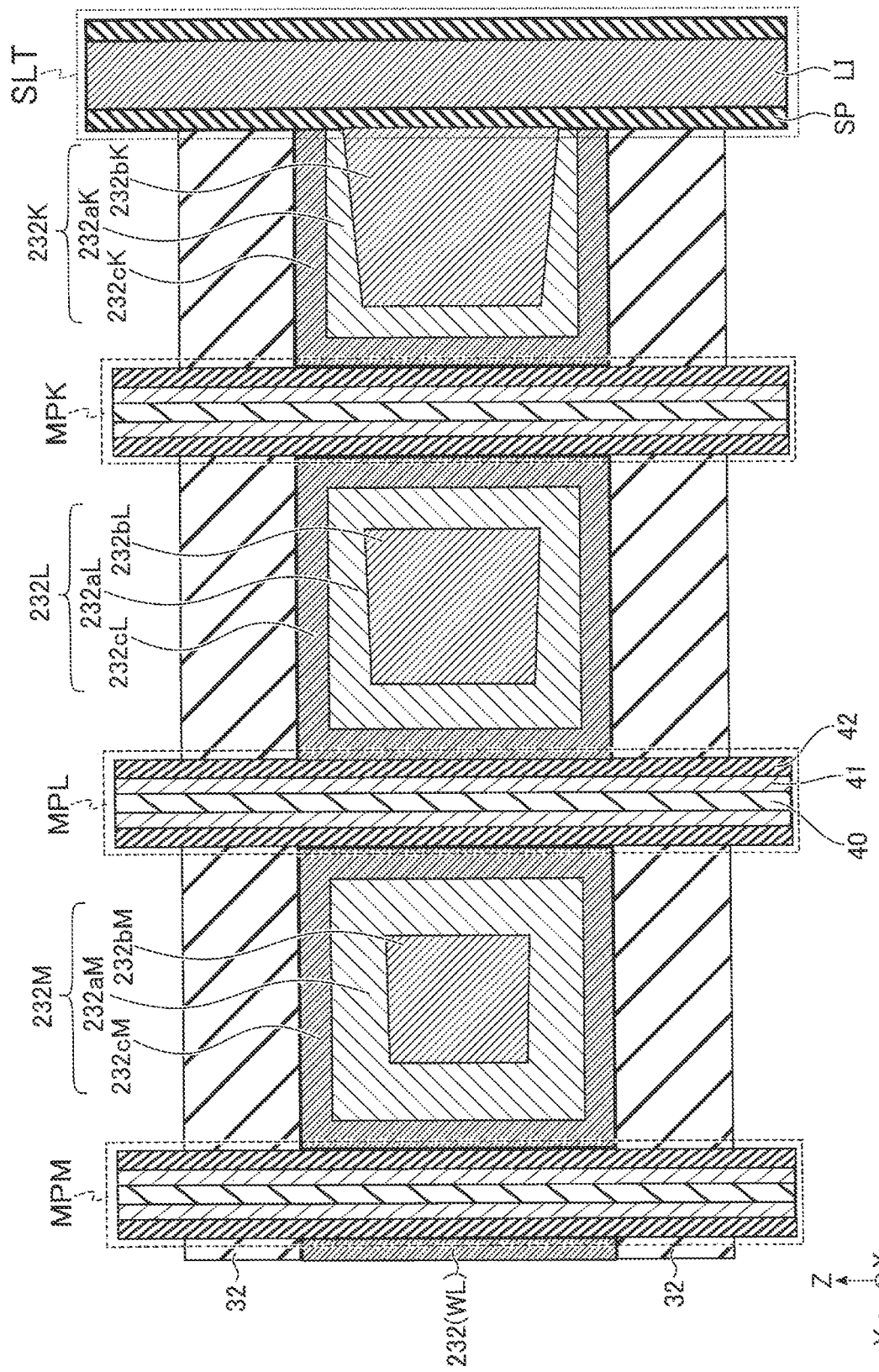
FIG. 25 shows an example of a cross-sectional structure of a memory cell array 10 included in a semiconductor memory device 1b according to a modification of the second embodiment.

Similarly, in the second embodiments described above, the second block insulating film 53 is formed between the insulating layer 32 and the conductive layer 232. However, the second block insulating film 53 may be omitted. FIG. 25 shows an example of a cross-sectional structure of a memory cell array 10 included in a semiconductor memory device 1b according to a modification of the second embodiment.

FIG. 25 shows a cross section of the same area as that shown in FIG. 20. As shown in FIG. 25, the memory cell array 10 according to the modification of the second embodiment does not include the second block insulating film 53. For this reason, the conductive layer 232c is in contact with the insulating layer 32.

In the first and second embodiments, the configuration of the semiconductor memory devices 1 and 1b may be different from the above-described configuration.

Herein, the term "couple" refers to electrical coupling, and does not exclude interposition of another component. Expressions such as "electrically coupled" cover insulator-interposed coupling that allows for the same operation as electrical coupling without an insulator. Expressions such as "substantially the same", "approximately the same", and "approximately uniform" allow for errors caused by manufacturing variations.

The first and second embodiments of the present inventions are presented by way of example only, and are not intended to limit the scope of the inventions. The first and second embodiments may be embodied in various forms, and various omissions, replacements, and changes can be made thereon without departing from the spirit of the invention. The first and second embodiments and modifications thereof are included in the scope and gist of the invention, and are included in the scope of the invention described in the claims and its equivalence.

The invention claimed is:

1. A semiconductor memory device comprising:
a first insulating layer;
a first conductive layer provided above the first insulating layer and containing tungsten, the first conductive layer including a first sub conductive layer and a second sub conductive layer;
a first pillar that passes through the first insulating layer and the first conductive layer and extends in a first direction;
a second pillar that passes through the first insulating layer and the first conductive layer and extends in the first direction; and
a second insulating layer that extends in a second direction and divides the first insulating layer and the first conductive layer, the second direction intersecting with the first direction, wherein
the first pillar is located between the second insulating layer and the second pillar with respect to a third direction that intersects the first direction and the second direction,
the first sub conductive layer is in contact with the second sub conductive layer and is provided between the second sub conductive layer and the first insulating layer,
a fluorine concentration in the first sub conductive layer is lower than that in the second sub conductive layer,
the first sub conductive layer includes a first portion located between the second insulating layer and the first pillar and a second portion located between the first pillar and the second pillar, and
a thickness of the first sub conductive layer in the first portion is smaller than that of the first sub conductive layer in the second portion.

2. The semiconductor memory device according to claim 1, wherein
the first sub conductive layer is in contact with the first insulating layer.

3. The semiconductor memory device according to claim 1, further comprising a third insulating layer that is in contact with the first sub conductive layer on a side opposite the second sub conductive layer.

4. The semiconductor memory device according to claim 3, wherein
the third insulating layer contains oxygen and aluminum.

5. The semiconductor memory device according to claim 1, wherein
no TiN or TiAlN is contained between the first sub conductive layer and the first insulating layer.

6. The semiconductor memory device according to claim 1, wherein
an oxygen concentration in the first sub conductive layer is higher than that in the second sub conductive layer.

7. The semiconductor memory device according to claim 1, wherein the first conductive layer further comprises a third sub conductive layer containing tungsten, oxygen, and nitrogen and provided between the first sub conductive layer and the first insulating layer.

8. The semiconductor memory device according to claim 7, wherein
the third sub conductive layer includes crystals having a smaller particle size than that of crystals included in the first sub conductive layer.

9. The semiconductor memory device according to claim 7, wherein
an oxygen concentration in the third sub conductive layer is higher than that in the second sub conductive layer.

10. The semiconductor memory device according to claim 1, further comprising a third pillar that extends in the first direction and passes through the first insulating layer and the first conductive layer, the second pillar being interposed between the first pillar and the third pillar, wherein
the first sub conductive layer further includes a third portion interposed between the second pillar and the third pillar, and
a thickness of the first sub conductive layer in the second portion is smaller than that of the first sub conductive layer in the third portion.

* * * * *